US012660190B2

(12) United States Patent
 Scarbrough et al.

(10) Patent No.: US 12,660,190 B2
(45) Date of Patent: Jun. 16, 2026

(54) INTERVENING POLYSILICON MATERIALS THAT ARE THICKER AT DISTAL EDGES THAN AT PILLARS DEFINING MEMORY CELLS AND RELATED APPARATUSES, SYSTEMS, AND METHODS

(71) Applicant: Micron Technology, Inc., Boise, ID (US)

(72) Inventors: Alyssa N. Scarbrough, Boise, ID (US);
John D. Hopkins, Meridian, ID (US);
Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 735 days.

(21) Appl. No.: 17/929,965

(22) Filed: Sep. 6, 2022

(65) Prior Publication Data
US 2024/0081070 A1     Mar. 7, 2024

(51) Int. Cl.
*H10B 43/35*      (2023.01)
*H10B 41/23*      (2023.01)
*H10B 41/35*      (2023.01)
*H10B 43/27*      (2023.01)

(52) U.S. Cl.
CPC ............. *H10B 43/35* (2023.02); *H10B 41/23* (2023.02); *H10B 41/35* (2023.02); *H10B 43/27* (2023.02)

(58) Field of Classification Search
CPC ........ H10B 43/35; H10B 41/23; H10B 41/35; H10B 43/27; H10B 43/10
See application file for complete search history.

(56) References Cited

U.S. PATENT DOCUMENTS

| | | | | |
|---|---|---|---|---|
| 2017/0148811 A1* | 5/2017 | Zhang | .................... | H10B 41/27 |
| 2017/0213843 A1* | 7/2017 | Choi | .................... | H10D 64/511 |
| 2018/0254285 A1* | 9/2018 | Lee | ........................ | H10B 43/27 |
| 2020/0350168 A1* | 11/2020 | Kim | .................. | H01L 21/02532 |
| 2022/0238684 A1* | 7/2022 | Lindemann | ............ | H10B 43/35 |

* cited by examiner

*Primary Examiner* — Galina G Yushina

(74) *Attorney, Agent, or Firm* — TraskBritt

(57)          ABSTRACT

Source terminals of memory devices and related apparatuses, computing systems, and methods are disclosed. An apparatus includes a first polysilicon material, a second polysilicon material offset from the first polysilicon material, an intervening polysilicon material between the first polysilicon material and the second polysilicon material, and pillars defining memory cells. The pillars extend through the second polysilicon material and a proximal portion of the intervening polysilicon material into the first polysilicon material. The one or more insulative materials are at a distal edge of the intervening polysilicon material. The intervening polysilicon material is thicker at the distal edge than at the pillars. A method includes removing, using an isotropic etch process, portions of the first polysilicon material and the second polysilicon material in a trench and forming the intervening polysilicon material between the first polysilicon material and the second polysilicon material.

18 Claims, 25 Drawing Sheets

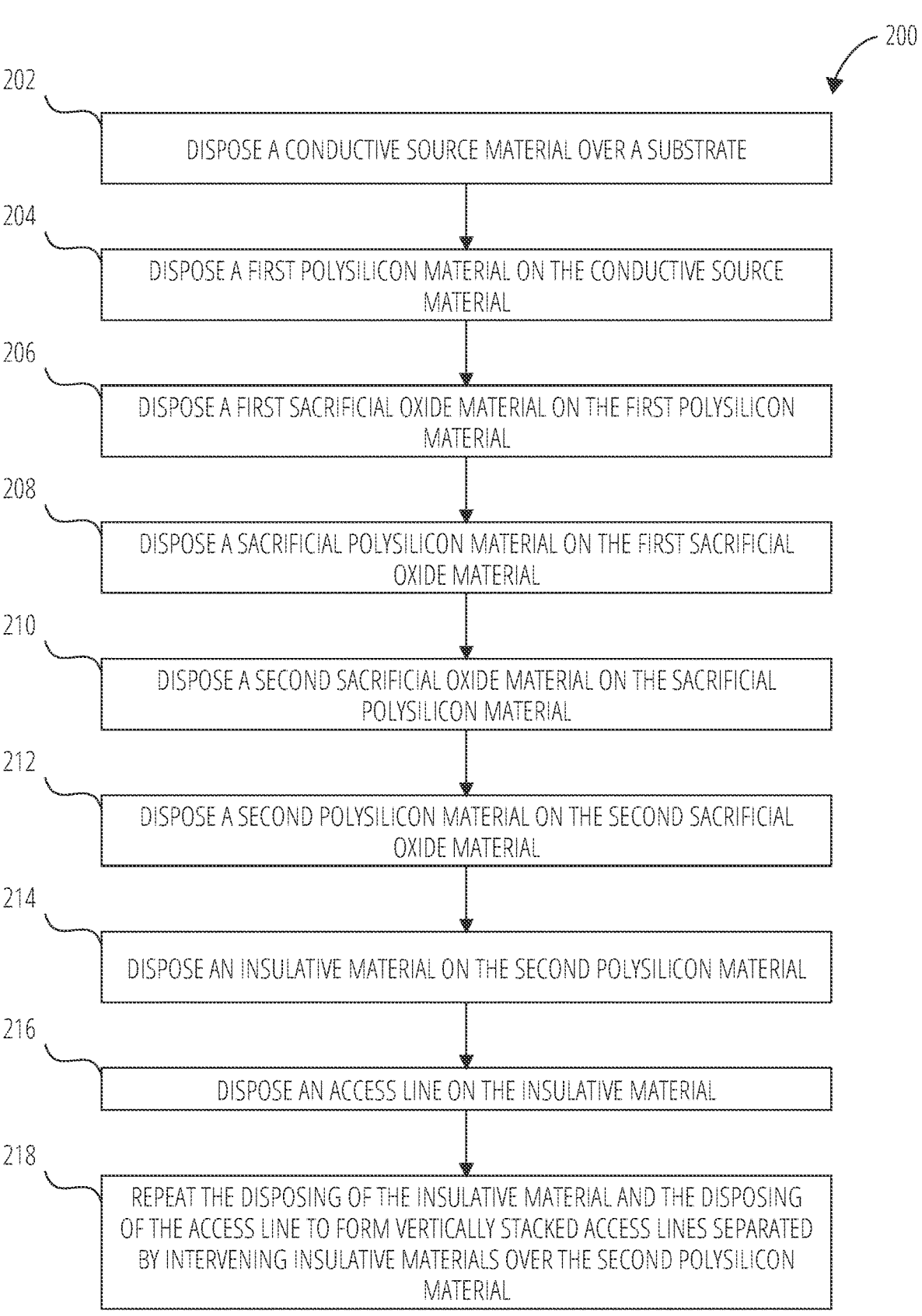

200

202  DISPOSE A CONDUCTIVE SOURCE MATERIAL OVER A SUBSTRATE

204  DISPOSE A FIRST POLYSILICON MATERIAL ON THE CONDUCTIVE SOURCE MATERIAL

206  DISPOSE A FIRST SACRIFICIAL OXIDE MATERIAL ON THE FIRST POLYSILICON MATERIAL

208  DISPOSE A SACRIFICIAL POLYSILICON MATERIAL ON THE FIRST SACRIFICIAL OXIDE MATERIAL

210  DISPOSE A SECOND SACRIFICIAL OXIDE MATERIAL ON THE SACRIFICIAL POLYSILICON MATERIAL

212  DISPOSE A SECOND POLYSILICON MATERIAL ON THE SECOND SACRIFICIAL OXIDE MATERIAL

214  DISPOSE AN INSULATIVE MATERIAL ON THE SECOND POLYSILICON MATERIAL

216  DISPOSE AN ACCESS LINE ON THE INSULATIVE MATERIAL

218  REPEAT THE DISPOSING OF THE INSULATIVE MATERIAL AND THE DISPOSING OF THE ACCESS LINE TO FORM VERTICALLY STACKED ACCESS LINES SEPARATED BY INTERVENING INSULATIVE MATERIALS OVER THE SECOND POLYSILICON MATERIAL

FIG. 2

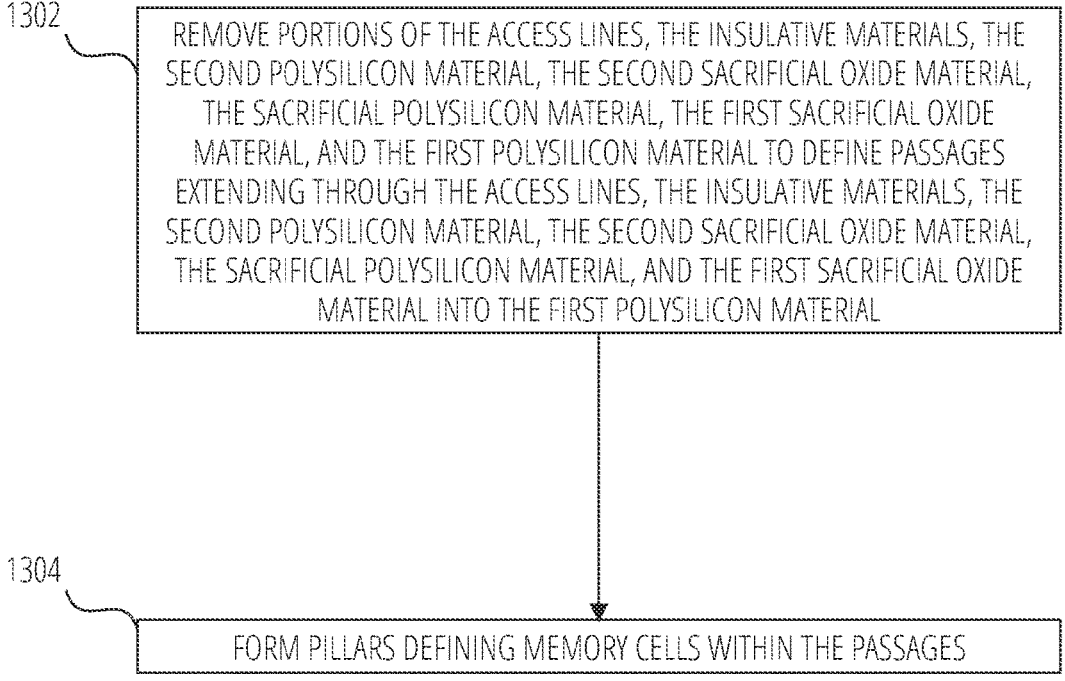

1302 — REMOVE PORTIONS OF THE ACCESS LINES, THE INSULATIVE MATERIALS, THE SECOND POLYSILICON MATERIAL, THE SECOND SACRIFICIAL OXIDE MATERIAL, THE SACRIFICIAL POLYSILICON MATERIAL, THE FIRST SACRIFICIAL OXIDE MATERIAL, AND THE FIRST POLYSILICON MATERIAL TO DEFINE PASSAGES EXTENDING THROUGH THE ACCESS LINES, THE INSULATIVE MATERIALS, THE SECOND POLYSILICON MATERIAL, THE SECOND SACRIFICIAL OXIDE MATERIAL, THE SACRIFICIAL POLYSILICON MATERIAL, AND THE FIRST SACRIFICIAL OXIDE MATERIAL INTO THE FIRST POLYSILICON MATERIAL

1304 — FORM PILLARS DEFINING MEMORY CELLS WITHIN THE PASSAGES

FIG. 13

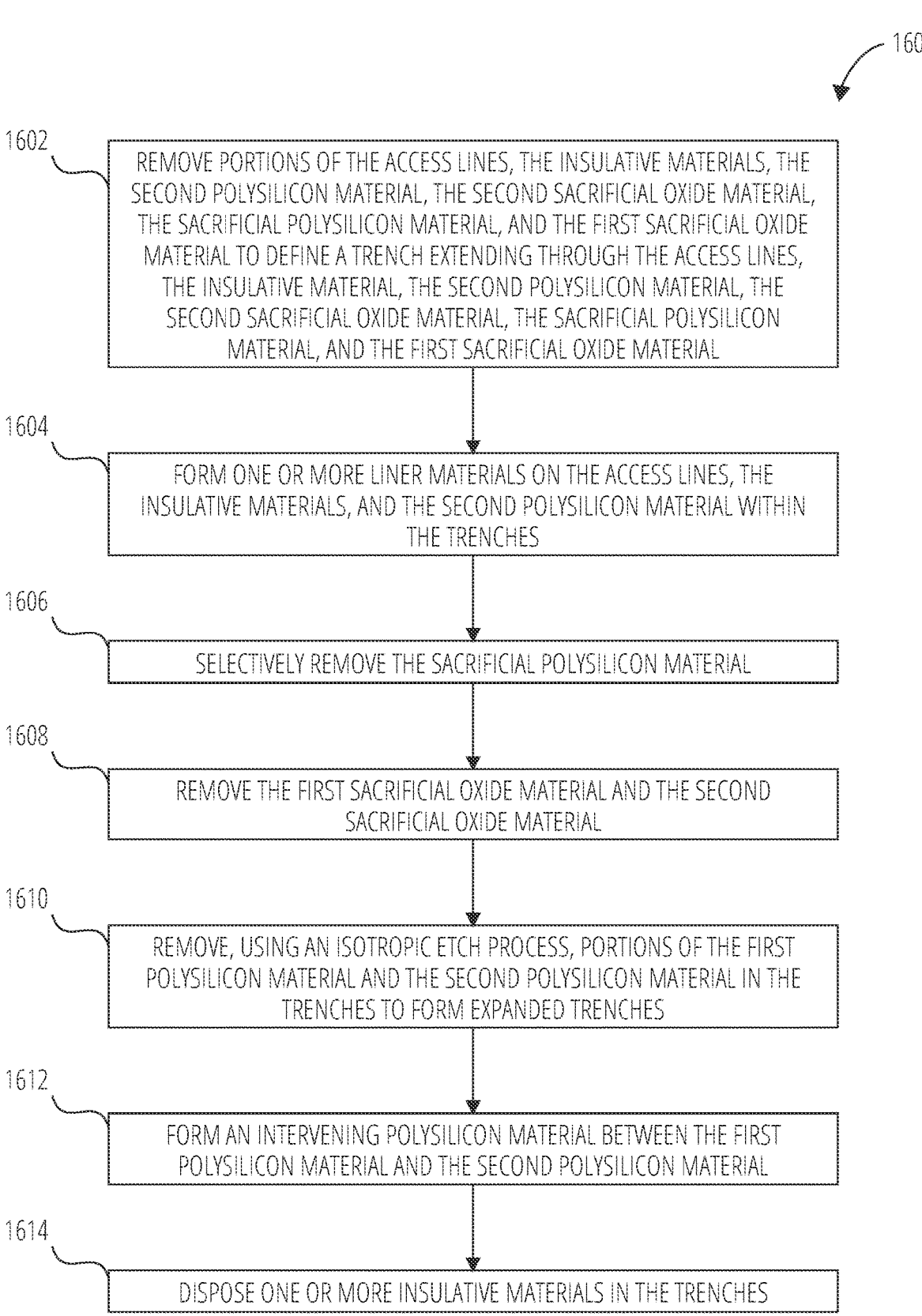

1600

1602 REMOVE PORTIONS OF THE ACCESS LINES, THE INSULATIVE MATERIALS, THE SECOND POLYSILICON MATERIAL, THE SECOND SACRIFICIAL OXIDE MATERIAL, THE SACRIFICIAL POLYSILICON MATERIAL, AND THE FIRST SACRIFICIAL OXIDE MATERIAL TO DEFINE A TRENCH EXTENDING THROUGH THE ACCESS LINES, THE INSULATIVE MATERIAL, THE SECOND POLYSILICON MATERIAL, THE SECOND SACRIFICIAL OXIDE MATERIAL, THE SACRIFICIAL POLYSILICON MATERIAL, AND THE FIRST SACRIFICIAL OXIDE MATERIAL

1604 FORM ONE OR MORE LINER MATERIALS ON THE ACCESS LINES, THE INSULATIVE MATERIALS, AND THE SECOND POLYSILICON MATERIAL WITHIN THE TRENCHES

1606 SELECTIVELY REMOVE THE SACRIFICIAL POLYSILICON MATERIAL

1608 REMOVE THE FIRST SACRIFICIAL OXIDE MATERIAL AND THE SECOND SACRIFICIAL OXIDE MATERIAL

1610 REMOVE, USING AN ISOTROPIC ETCH PROCESS, PORTIONS OF THE FIRST POLYSILICON MATERIAL AND THE SECOND POLYSILICON MATERIAL IN THE TRENCHES TO FORM EXPANDED TRENCHES

1612 FORM AN INTERVENING POLYSILICON MATERIAL BETWEEN THE FIRST POLYSILICON MATERIAL AND THE SECOND POLYSILICON MATERIAL

1614 DISPOSE ONE OR MORE INSULATIVE MATERIALS IN THE TRENCHES

FIG. 16

INTERVENING POLYSILICON MATERIALS THAT ARE THICKER AT DISTAL EDGES THAN AT PILLARS DEFINING MEMORY CELLS AND RELATED APPARATUSES, SYSTEMS, AND METHODS

TECHNICAL FIELD

This disclosure relates generally to an intervening polysilicon material that is thicker at a distal edge than at pillars defining memory cells, and more specifically to a source terminal including such an intervening polysilicon material between a first polysilicon material and a second polysilicon material.

BACKGROUND

Demand for ever smaller features in integrated circuit device structures and higher density of devices in these integrated circuit device structures has driven integrated circuit device manufacturers to resort to three-dimensional structures. For example, rather than manufacture memory cells of a memory array in a two-dimensional arrangement, three-dimensional arrangements of memory cells may be used to place a relatively larger number of memory cells in an equivalent two-dimensional chip area.

Complications arise in manufacturing three-dimensional devices, which may make it difficult to assure that components are properly electrically connected. Failure to properly electrically connect devices within an integrated circuit device structure may result in device failures.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 2 is a flowchart illustrating a method of manufacturing a stack of materials that may be used to manufacture the integrated circuit device structure of FIG. 1A and FIG. 1, according to some embodiments;

FIG. 13 is a flowchart illustrating a method of forming pillars defining memory cells in the stack of FIG. 12A and FIG. 12B, according to some embodiments;

FIG. 16 is a flowchart illustrating a method of manufacturing an integrated circuit device structure (e.g., the integrated circuit device structure of FIG. 1A, without limitation) from the stack of FIG. 15A and FIG. 15B, according to some embodiments;

DETAILED DESCRIPTION

Figures 1A, 1B:
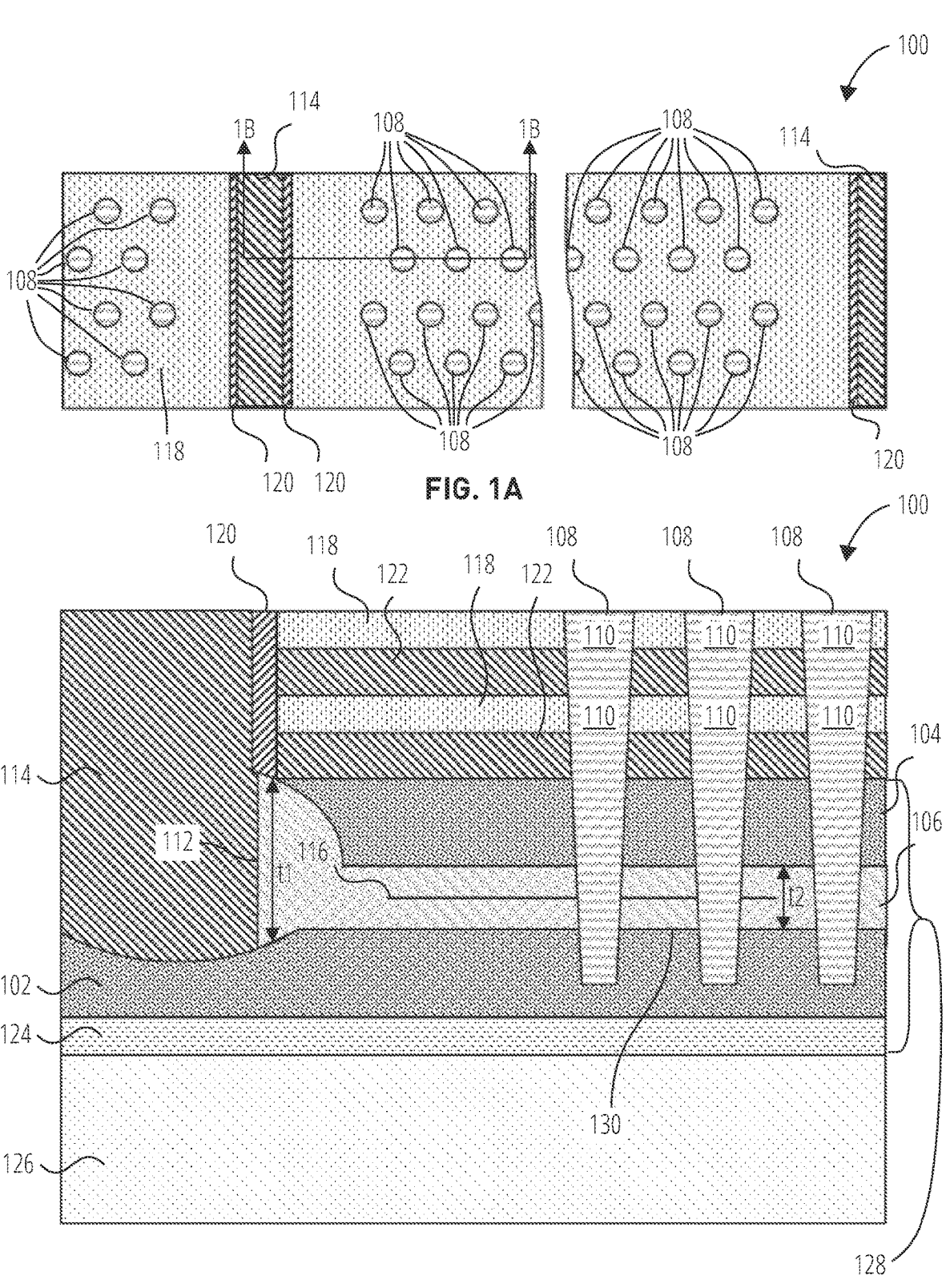
FIG. 1A is a plan view of a portion of an integrated circuit device structure, according to some embodiments.
FIG. 1B is a cross-sectional view of the integrated circuit device structure of FIG. 1A taken through line 1B of FIG. 1A.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped polycrystalline or monocrystalline semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, the term "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the terms "semiconductor material" and "semiconductive material" refer to a material having an electrical conductivity between those of electrically insulating materials and electrically conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials.

As used herein, the term "monocrystalline semiconductor material" refers to a semiconductor material including particles (e.g., atoms, molecules) that are arranged in a substantially continuous crystal lattice that is substantially free of grain boundaries within the semiconductor material. A substrate of a semiconductor material may include a monocrystalline semiconductor material such as single-crystal silicon. A substrate including monocrystalline semiconductor material may serve as a substrate material for various devices and structures disclosed herein.

As used herein, the term "polycrystalline semiconductor material" refers to a semiconductor material including multiple crystals, sometimes known as crystallites or grains, of the semiconductor material. In contrast with monocrystalline semiconductor material, polycrystalline semiconductor material includes grain boundaries within the semiconductor material. Polycrystalline silicon, which is also known as "polysilicon" and "poly," is an example of a polycrystalline semiconductor material.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the terms "electrically connect" and "electrically connected" refer to both direct and indirect electrical connections.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

A source terminal in a microelectronic device (e.g., a three-dimensional NAND memory device) may electrically connect to multiple pillars defining memory cells. If a seam is formed within conductive material of the source terminal during manufacturing of the microelectronic device, reactive species used in subsequent process operations may enter the seam and attack the conductive material, which may open the seam and electrically disconnect the source terminal from one or more of the pillars. As a result, memory cells, especially those defined by a pillar that is closest to an edge of an array, may be electrically disconnected from the source terminal.

According to various embodiments disclosed herein, an isotropic etch may be used create a so-called "bulbous-shaped" opening, in cross-section, in a trench, through which a gap may be filled with a polycrystalline semiconductor material (e.g., polysilicon) to form a portion of a source terminal (e.g., a source contact) for the microelectronic device (e.g., the three-dimensional NAND memory device). A thicker portion at an edge of the filled polycrystalline semiconductor material resulting from the bulbous-shaped opening may protect (e.g., seal) any seam within the filled polycrystalline semiconductor material from attack by radicals in subsequent process operations. Accordingly, the likelihood of pillars electrically disconnecting from the source terminal may be reduced.

In some embodiments, an apparatus includes a first polysilicon material, a second polysilicon material, an intervening polysilicon material, pillars, and one or more insulative materials. The second polysilicon material is offset from the first polysilicon material. The intervening polysilicon material is between the first polysilicon material and the second polysilicon material. The pillars define memory cells. The pillars extend through the second polysilicon material and a proximal portion of the intervening polysilicon material into the first polysilicon material. The one or more insulative materials are at a distal edge of the intervening polysilicon material. The intervening polysilicon material is thicker at the distal edge than at the pillars.

In some embodiments, a method of manufacturing an integrated circuit device structure includes removing portions of access lines, insulative materials, a second polysilicon material, a second sacrificial oxide material, a sacrificial polysilicon material, and a first sacrificial oxide material to define a trench extending through the access lines, the insulative materials, the second polysilicon material, the second sacrificial oxide material, the sacrificial polysilicon material, and the first sacrificial oxide material. The method also includes forming one or more liner materials on the access lines, the insulative materials, and the second polysilicon material within the trench. The method further includes removing the sacrificial polysilicon material, removing the first sacrificial oxide material and the second sacrificial oxide material, and removing, using an isotropic etch process, portions of the first polysilicon material and the second polysilicon material in the trench to form an expanded trench. The method also includes forming an intervening polysilicon material between the first polysilicon material and the second polysilicon material.

In some embodiments, an apparatus includes pillars defining memory cells and a source terminal for the memory cells. The pillars terminate at a proximal portion of the source terminal. The source terminal includes an intervening polysilicon material between a first polysilicon material and a second polysilicon material. The intervening polysilicon material is thicker at a distal edge away from the pillars than at the proximal portion.

In some embodiments, a computing system includes one or more processors and one or more memory devices. The one or more memory devices include pillars defining memory cells and a source terminal. The pillars are electrically connected to the source terminal. The source terminal includes a thicker portion of an intervening polysilicon material at a distal edge away from the pillars than at a proximal portion at the pillars.

FIG. 1A is a plan view of a portion of an integrated circuit device structure 100, according to some embodiments.

FIG. 1B is a cross-sectional view of the integrated circuit device structure 100 of FIG. 1A taken through line 1B of FIG. 1A. Referring to FIG. 1A and FIG. 1B together, the integrated circuit device structure 100 includes a first polysilicon material 102, a second polysilicon material 104, an intervening polysilicon material 106, pillars 108, and one or more insulative materials 114. The second polysilicon material 104 is offset from the first polysilicon material 102 with the intervening polysilicon material 106 between the first polysilicon material 102 and the second polysilicon material 104. The pillars 108 define memory cells 110 (e.g., metal-oxide-nitride-oxide-semiconductor (MONOS) memory cells). The pillars 108 extend through the second polysilicon material 104 and the intervening polysilicon material 106 into the first polysilicon material 102. The intervening polysilicon material 106 is electrically coupled to the pillars 108 that include the memory cells 110. The one or more insulative materials 114 are at a distal edge 112 of the intervening polysilicon material 106, with the distal edge 112 being distal to the pillars 108. The intervening polysilicon material 106 is thicker at the distal edge 112 than at a proximal portion 130, which is at the pillars 108. For example, a first thickness t1 at the distal edge 112 of the intervening polysilicon material 106 is greater than a second thickness t2 of the intervening polysilicon material 106 at the proximal portion 130. Accordingly, one or more of the first polysilicon material 102 or the second polysilicon material 104 are thinner proximate to the distal edge 112 of the intervening polysilicon material 106 than proximate to the proximal portion 130 of the intervening polysilicon material 106. In some embodiments, the intervening polysilicon material 106 separates the second polysilicon material 104 from the one or more insulative materials 114, as illustrated in FIG. 1B. A portion of the intervening polysilicon material 106 proximal to the one or more insulative materials 114 exhibits a greater thickness t1 than the proximal portion 130, which is distal to the one or more insulative materials 114. The greater thickness of the distal edge 112 of the intervening polysilicon material 106 separates the second polysilicon material 104 from the one or more insulative materials 114. Therefore, the second polysilicon material 104 may not directly contact the one or more insulative materials 114 proximal to the distal edge 112 of the intervening polysilicon material 106.

In some embodiments, the intervening polysilicon material 106 is formed by forming (e.g., growing, depositing) the intervening polysilicon material 106 from the first polysilicon material 102 and the second polysilicon material 104, which may create a seam 116 within the intervening polysilicon material 106 where surfaces formed from the first polysilicon material 102 and the second polysilicon material 104 meet. Accordingly, the intervening polysilicon material 106 defines the seam 116 therein (e.g., within the intervening polysilicon material 106) away from the distal edge 112. The thicker portion of the intervening polysilicon material 106 at the distal edge 112 may effectively protect the seam 116 behind the thicker portion of the intervening polysilicon material 106, which may substantially reduce the likelihood of or substantially prevent etching agents from entering the seam 116 during manufacturing of the integrated circuit device structure 100. In turn, these etching agents may be less likely to widen the seam 116, reducing the likelihood that one or more of the pillars 108 will be electrically disconnected.

In some embodiments, the one or more insulative materials 114 extend at least partially into the first polysilicon material 102, as illustrated in FIG. 1B. As will be discussed in more detail below, the one or more insulative materials 114 may be formed in a trench (e.g., trench 2104 of FIG. 22A and FIG. 22B) following an isotropic etch illustrated in FIG. 21B. This isotropic etch may remove some of the first polysilicon material 102 so that when the one or more insulative materials 114 are disposed in the trench 2104, the one or more insulative materials 114 extend partially into the first polysilicon material 102. By way of non-limiting example, an interface between the one or more insulative materials 114 and the first polysilicon material 102 may be non-planar (e.g., curved) (e.g., because of the isotropic etch) rather than planar.

The integrated circuit device structure 100 also includes multiple access lines (e.g., word lines) 118 formed over the second polysilicon material 104 and insulative materials 122 to electrically isolate the access lines 118 from each other and from the second polysilicon material 104. For example, the integrated circuit device structure 100 includes an insulative material 122 on the second polysilicon material 104, an access line 118 on that insulative material 122, another insulative material 122 on that access line 118, and another access line 118 on the other insulative material 122. FIG. 1B illustrates that the integrated circuit device structure 100 includes a stack of two access lines 118. It should be noted, however, that the integrated circuit device structure 100 may include a stack of more than two access lines 118, though a stack of more than two access lines 118 is not shown for the sake of simplicity of the disclosure. More than two sets of the insulative material 122 and the access line 118 may be disposed, depending on how many memory cells 110 are desired in each pillar 108. The number of access lines 118 may be equal to the number of memory cells 110 in each pillar 108 to provide separate access, via the access lines 118 to each of the memory cells 110. It should also be noted that the integrated circuit device structure 100 may further include access transistors, bitlines (e.g., digit lines, data lines), and/or above array structures above the view of the integrated circuit device structure 100 illustrated in FIG. 1A and FIG. 1B.

The integrated circuit device structure 100 includes one or more liner materials 120 between the one or more insulative materials 114 and the access lines 118. As will be discussed below, the one or more liner materials 120 may protect the access line 118 and the insulative material 122 from the isotropic etch process discussed with reference to FIG. 21B.

The integrated circuit device structure 100 may be part of a memory device. For example, the memory cells 110 may be part of a memory array of a memory device. The memory cells 110 may be located at intersections between the pillars 108 and the access lines 118. The integrated circuit device structure 100 further includes a conductive source material 124 (e.g., tungsten silicide ($WSi_x$)) over which the first polysilicon material 102, the intervening polysilicon material 106, and the second polysilicon material 104 are formed.

The first polysilicon material 102, the second polysilicon material 104, the intervening polysilicon material 106, and the conductive source material 124 may together be a source terminal 128 for the memory cells 110. The access lines 118 are formed over the source terminal 128. The source terminal includes the conductive source material 124 with the first polysilicon material 102, the intervening polysilicon material 106, and the second polysilicon material 104 disposed over the conductive source material 124. The pillars 108 may be electrically connected to the source terminal 128. The pillars 108 terminate within the first polysilicon material 102 of the source terminal 128. As previously discussed, the source terminal 128 includes the intervening polysilicon material 106 between the first polysilicon material 102 and the second polysilicon material 104. The intervening polysilicon material 106 is thicker at the distal edge 112 away from the pillars 108 than at the proximal portion 130.

The integrated circuit device structure 100 includes a substrate 126 (e.g., base material, semiconductor substrate), over which the conductive source material 124, the first polysilicon material 102, the intervening polysilicon material 106, the second polysilicon material 104, access lines 118, the insulative materials 122, the pillar 108, and the one or more insulative materials 114 are formed. Although not illustrated in FIG. 1A and FIG. 1, intervening structures may be positioned between the substrate 126 and the conductive source material 124. For example, under array structures such as page buffers and under array conductive materials may be positioned between the substrate 126 and the conductive source material 124. These under array structures are not shown in FIG. 1A and FIG. 1B in the interest of simplicity of the disclosure.

FIG. 2 is a flowchart illustrating a method 200 of manufacturing a stack 1202a (FIG. 12A and FIG. 12B) of materials that may be used to manufacture the integrated circuit device structure 100 of FIG. 1A and FIG. 1B, according to some embodiments.

FIG. 3A through FIG. 12B illustrate operations of the method 200 to manufacture the stack 1202a.

Figure 3A:
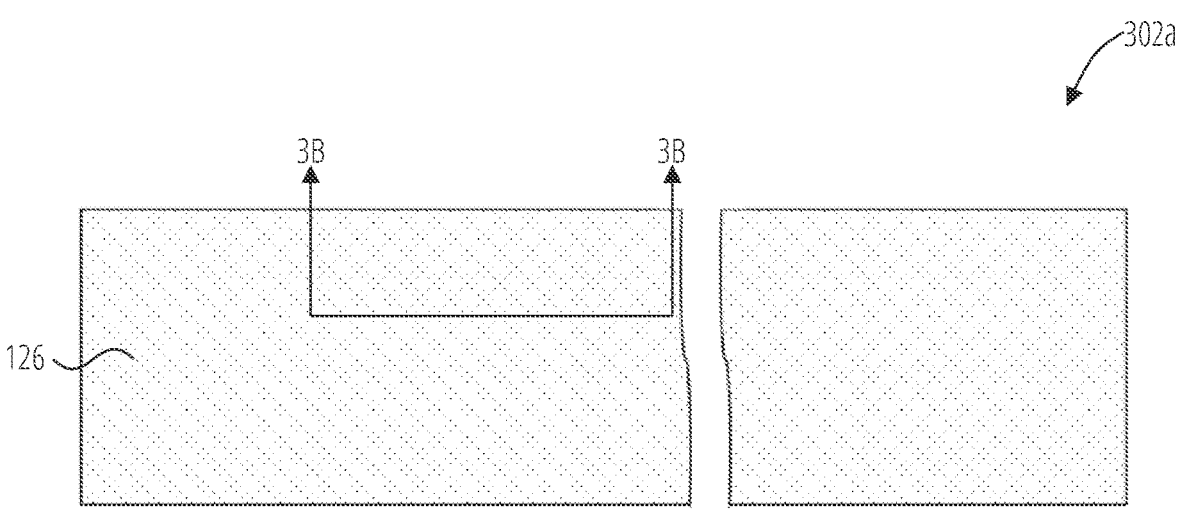
FIG. 3A is a plan view of a workpiece, according to some embodiments.

FIG. 3A is a plan view of a workpiece 302a, according to some embodiments.

Figure 3B:
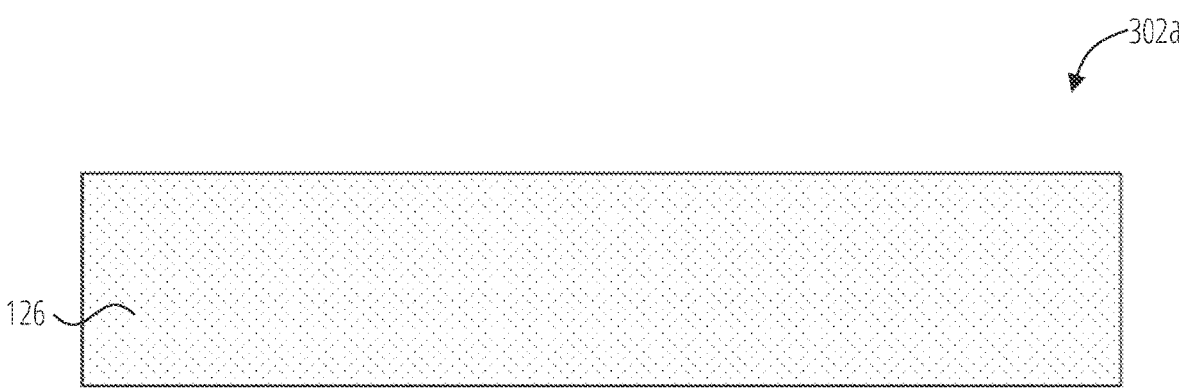
FIG. 3B is a cross-sectional view of the workpiece of FIG. 3A taken through line 3B of FIG. 3A.

FIG. 3B is a cross-sectional view of the workpiece 302a of FIG. 3A taken through line 3B of FIG. 3A. Referring to FIG. 3A and FIG. 3B together, the workpiece 302a includes the substrate 126. The method 200 includes various operations to dispose materials over the substrate 126, which is shown in FIG. 3A and FIG. 3B. FIG. 4A through FIG. 12B illustrate various materials over the substrate 126. As discussed above, however, intervening structures between the materials shown in FIG. 4A through FIG. 12B and the substrate 126 may be included, although not shown, between the substrate 126 and the materials that will be discussed with reference to FIG. 4A through FIG. 12B. For example, under array structures such as page buffers and under array conductive materials may be formed on the substrate 126, and the materials discussed with reference to FIG. 4A through FIG. 12B may be formed over the under array structures.

Figure 4A:
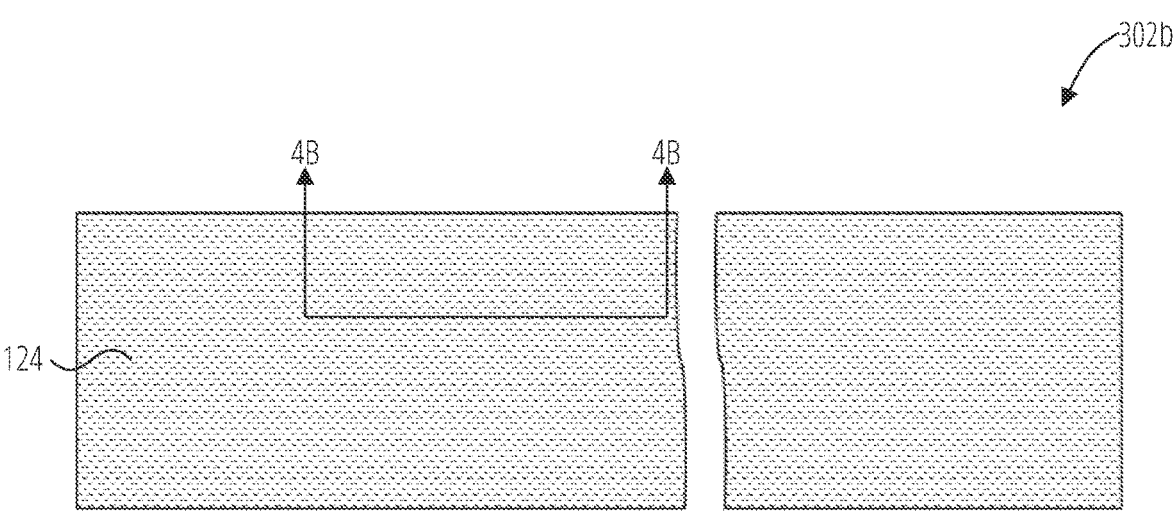
FIG. 4A is a plan view of a workpiece, which is the workpiece of FIG. 3A and FIG. 3B with a conductive source material over the substrate.

FIG. 4A is a plan view of a workpiece 302b, which is the workpiece 302a of FIG. 3A and FIG. 3B with a conductive source material 124 over the substrate 126.

Figure 4B:
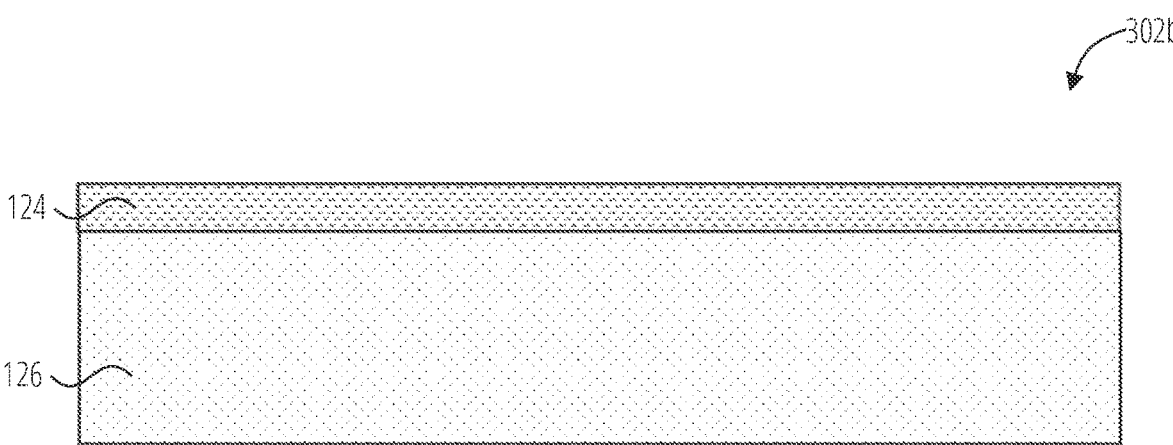
FIG. 4B is a cross-sectional view of the workpiece of FIG. 4A taken through line 4B of FIG. 4A.

FIG. 4B is a cross-sectional view of the workpiece 302b of FIG. 4A taken through line 4B of FIG. 4A. Referring to FIG. 2, FIG. 4A, and FIG. 4B together, at operation 202, the method 200 includes disposing the conductive source material 124 over the substrate 126. In some embodiments, disposing the conductive source material 124 over the substrate 126 includes forming a tungsten silicide ($WSi_x$) material (e.g., using a deposition process) over the substrate 126. By way of non-limiting example, a nucleation material of $WSi_x$ may be deposited (e.g., using a chemical vapor deposition (CVD) process) using a silicon source gas and a reactant gas, and a film of the $WSi_x$ may be deposited on the nucleation material using a CVD process (e.g., by using dichlorosilane ($SiH_2Cl_2$) as a silicon source gas).

Figure 5A:
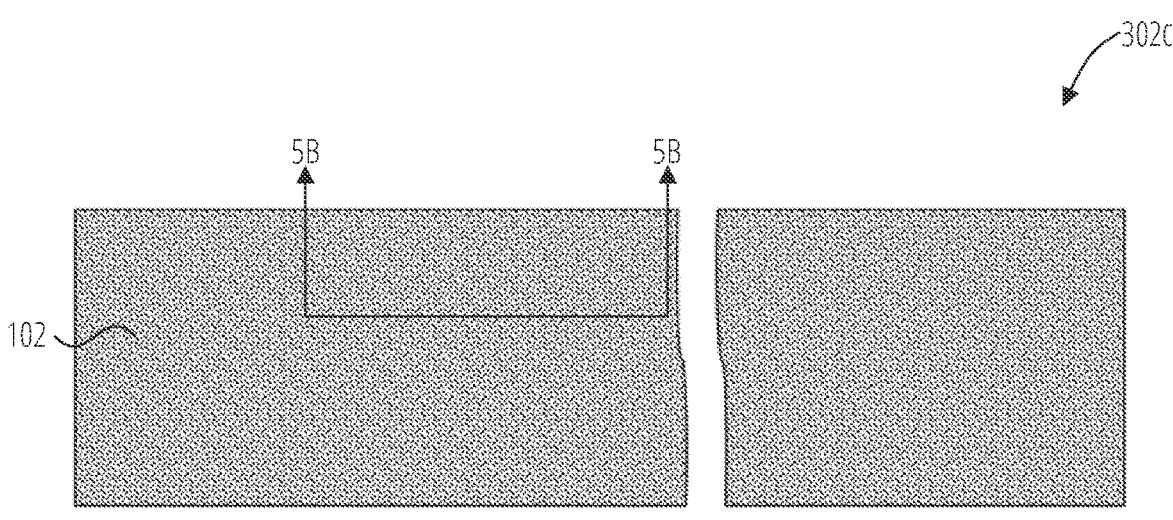
FIG. 5A is a plan view of a workpiece, which is the workpiece of FIG. 4A and FIG. 4B with a first polysilicon material on the conductive source material.

FIG. 5A is a plan view of a workpiece 302c, which is the workpiece 302b of FIG. 4A and FIG. 4B with a first polysilicon material 102 on the conductive source material 124.

Figure 5B:
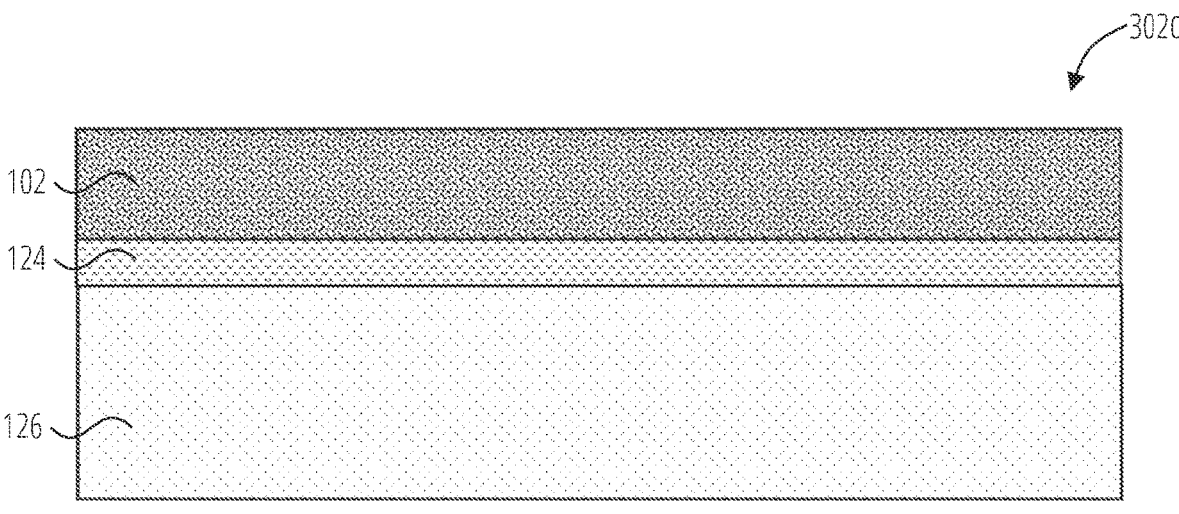
FIG. 5B is a cross-sectional view of the workpiece of FIG. 5A taken through line 5B of FIG. 5A.

FIG. 5B is a cross-sectional view of the workpiece 302c of FIG. 5A taken through line 5B of FIG. 5A. Referring to FIG. 2, FIG. 5A, and FIG. 5B together, at operation 204, the method 200 includes disposing a first polysilicon material 102 on the conductive source material 124. In some embodiments, disposing the first polysilicon material 102 on the conductive source material 124 includes depositing the first polysilicon material 102 on the conductive source material 124 using a CVD process (e.g., using silane).

Figure 6A:
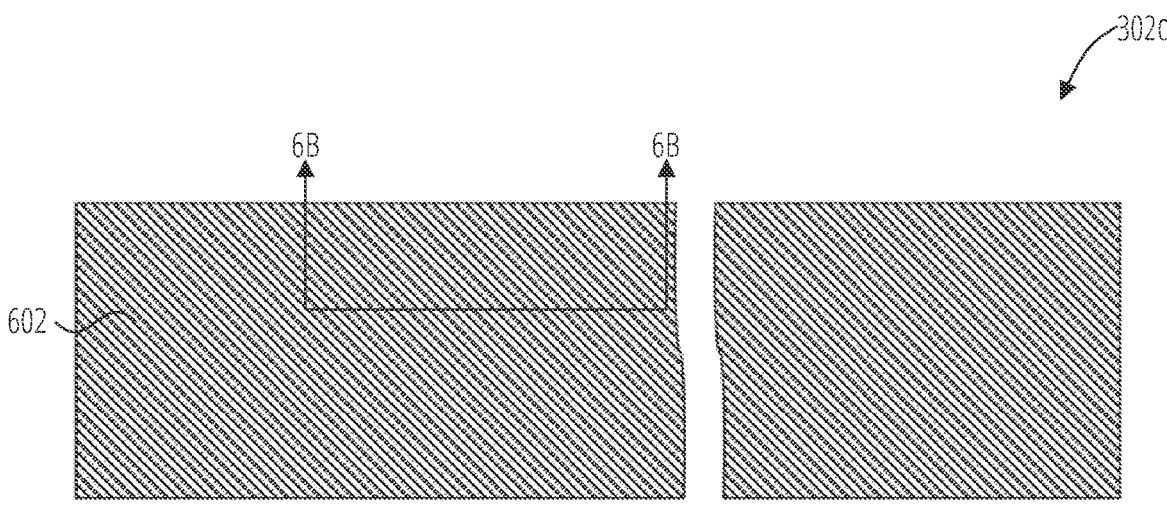
FIG. 6A is a plan view of a workpiece, which is the workpiece of FIG. 5A and FIG. 5B with a first sacrificial oxide material on the first polysilicon material.

FIG. 6A is a plan view of a workpiece 302d, which is the workpiece 302c of FIG. 5A and FIG. 5B with a first sacrificial oxide material 602 on the first polysilicon material 102.

Figure 6B:
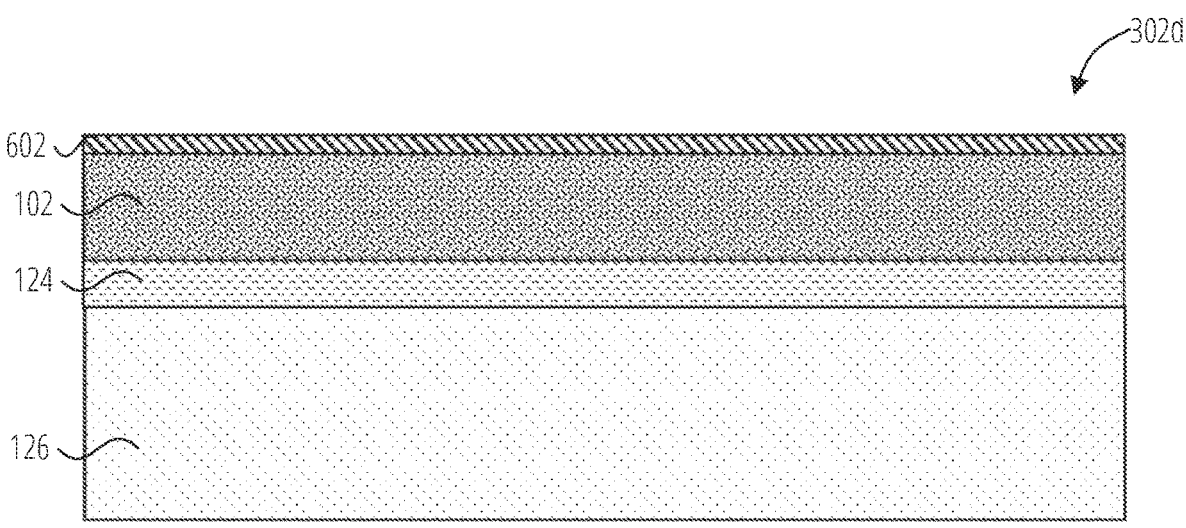
FIG. 6B is a cross-sectional view of the workpiece of FIG. 6A taken through line 6B of FIG. 6A.

FIG. 6B is a cross-sectional view of the workpiece 302d of FIG. 6A taken through line 6B of FIG. 6A. Referring to FIG. 2, FIG. 6A, and FIG. 6B together, at operation 206, the method 200 includes disposing a first sacrificial oxide material 602 on the first polysilicon material 102. In some embodiments, the first sacrificial oxide material 602 may include silicon and oxygen atoms (e.g., silicon dioxide ($SiO_2$)). In some embodiments, disposing the first sacrificial oxide material 602 on the first polysilicon material 102 includes one or more of depositing the first sacrificial oxide material 602 on the first polysilicon material 102, spinning on the first sacrificial oxide material 602 onto the first polysilicon material 102, or growing the first sacrificial oxide material 602 on the first polysilicon material 102.

Figure 7A:
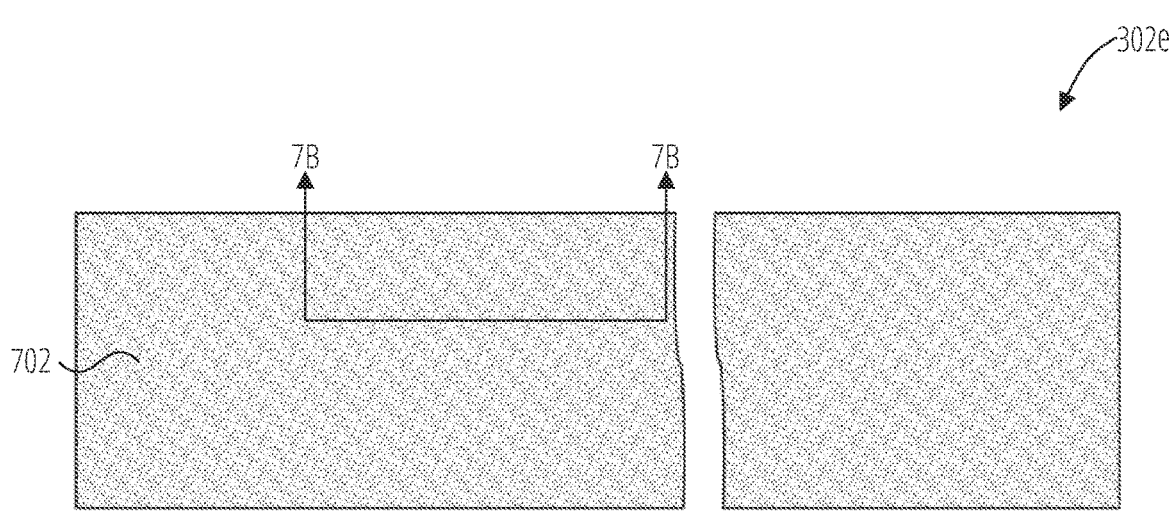
FIG. 7A is a plan view of a workpiece, which is the workpiece of FIG. 6A and FIG. 6B with a sacrificial polysilicon material on the first sacrificial oxide material.

FIG. 7A is a plan view of a workpiece 302e, which is the workpiece 302d of FIG. 6A and FIG. 6B with a sacrificial polysilicon material 702 on the first sacrificial oxide material 602.

Figure 7B:
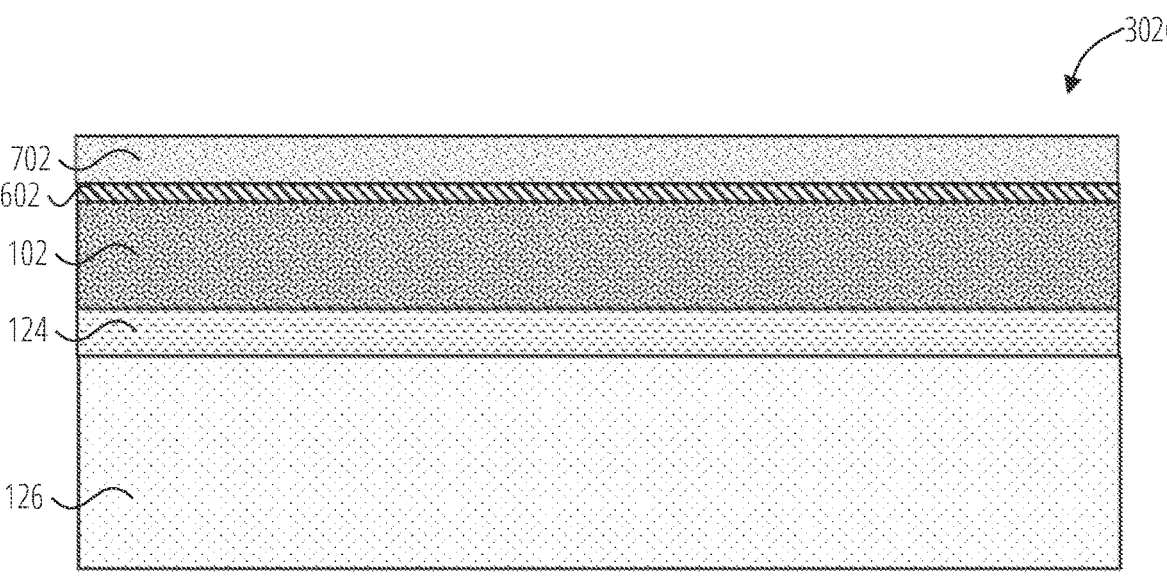
FIG. 7B is a cross-sectional view of the workpiece of FIG. 7A taken through line 7B of FIG. 7A.

FIG. 7B is a cross-sectional view of the workpiece 302e of FIG. 7A taken through line 7B of FIG. 7A. Referring to FIG. 2, FIG. 7A, and FIG. 7B together, at operation 208, the method 200 includes disposing a sacrificial polysilicon material 702 on the first sacrificial oxide material 602. In some embodiments, disposing the sacrificial polysilicon material 702 on the first sacrificial oxide material 602 includes depositing the sacrificial polysilicon material 702 on the first sacrificial oxide material 602 using a CVD process (e.g., using silane as a silicon source gas).

Figure 8A:
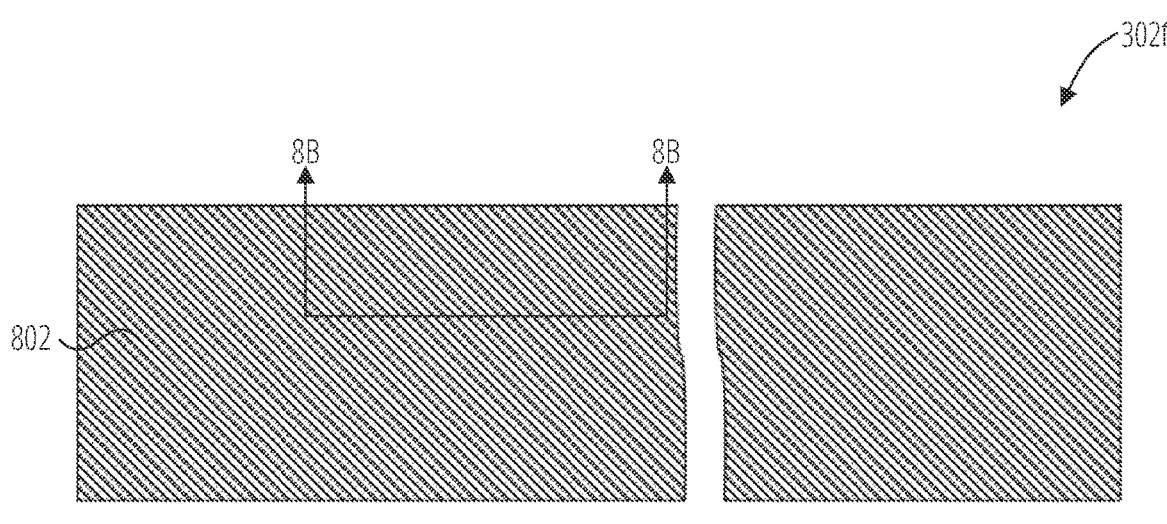
FIG. 8A is a plan view of a workpiece, which is the workpiece of FIG. 7A and FIG. 7B with a second sacrificial oxide material on the sacrificial polysilicon material.

FIG. 8A is a plan view of a workpiece 302f, which is the workpiece 302e of FIG. 7A and FIG. 7B with a second sacrificial oxide material 802 on the sacrificial polysilicon material 702.

Figure 8B:
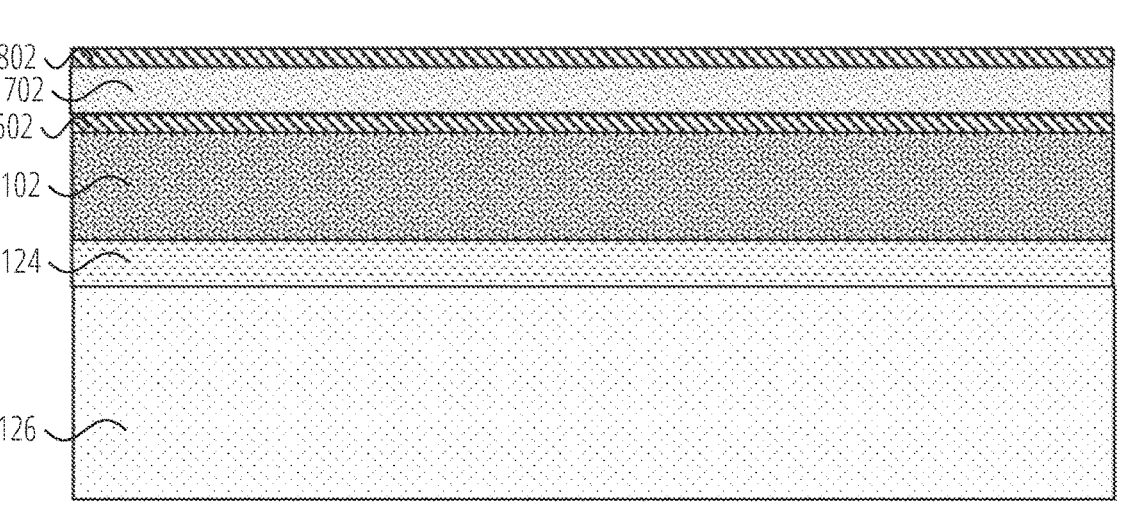
FIG. 8B is a cross-sectional view of the workpiece of FIG. 8A taken through line 8B of FIG. 8A.

FIG. 8B is a cross-sectional view of the workpiece 302f of FIG. 8A taken through line 8B of FIG. 8A. Referring to FIG. 2, FIG. 8A, and FIG. 8B together, at operation 210, the method 200 includes disposing a second sacrificial oxide material 802 on the sacrificial polysilicon material 702. In some embodiments, the second sacrificial oxide material 802 includes silicon dioxide. In some embodiments, disposing the second sacrificial oxide material 802 on the sacrificial polysilicon material 702 includes one or more of depositing the second sacrificial oxide material 802 on the first sacrificial oxide material 602, spinning on the second sacrificial oxide material 802 onto the first sacrificial oxide material 602, or growing the second sacrificial oxide material 802 on the first sacrificial oxide material 602. One or more of the materials of the first sacrificial oxide material 602, the sacrificial polysilicon material 702, and the second sacrificial oxide material 802 may be selectively removable relative to one another.

Figure 9A:
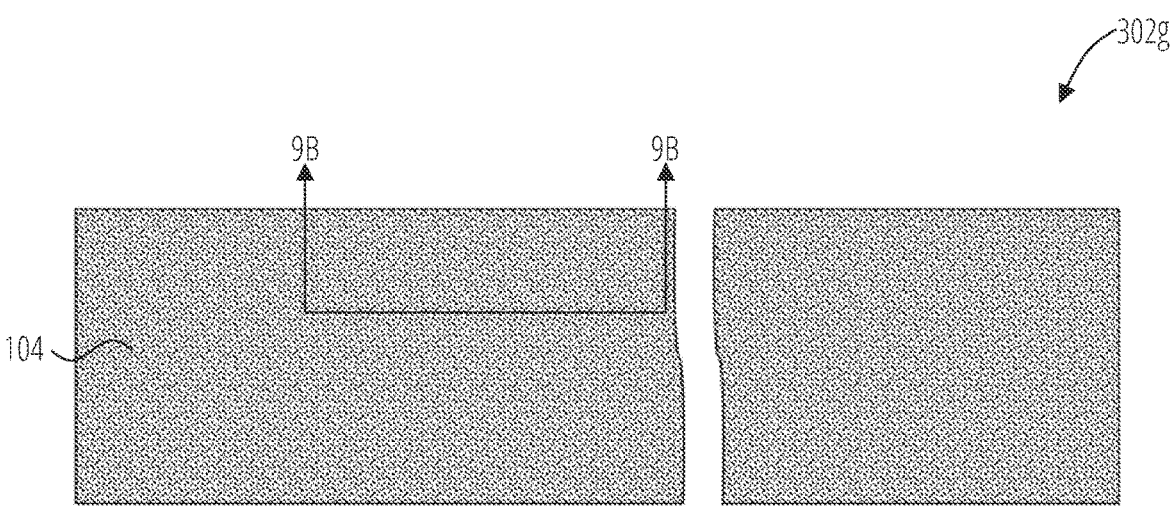
FIG. 9A is a plan view of a workpiece, which is the workpiece of FIG. 8A and FIG. 8B with a second polysilicon material on the second sacrificial oxide material.

FIG. 9A is a plan view of a workpiece 302g, which is the workpiece 302f of FIG. 8A and FIG. 8B with a second polysilicon material 104 on the second sacrificial oxide material 802.

Figure 9B:
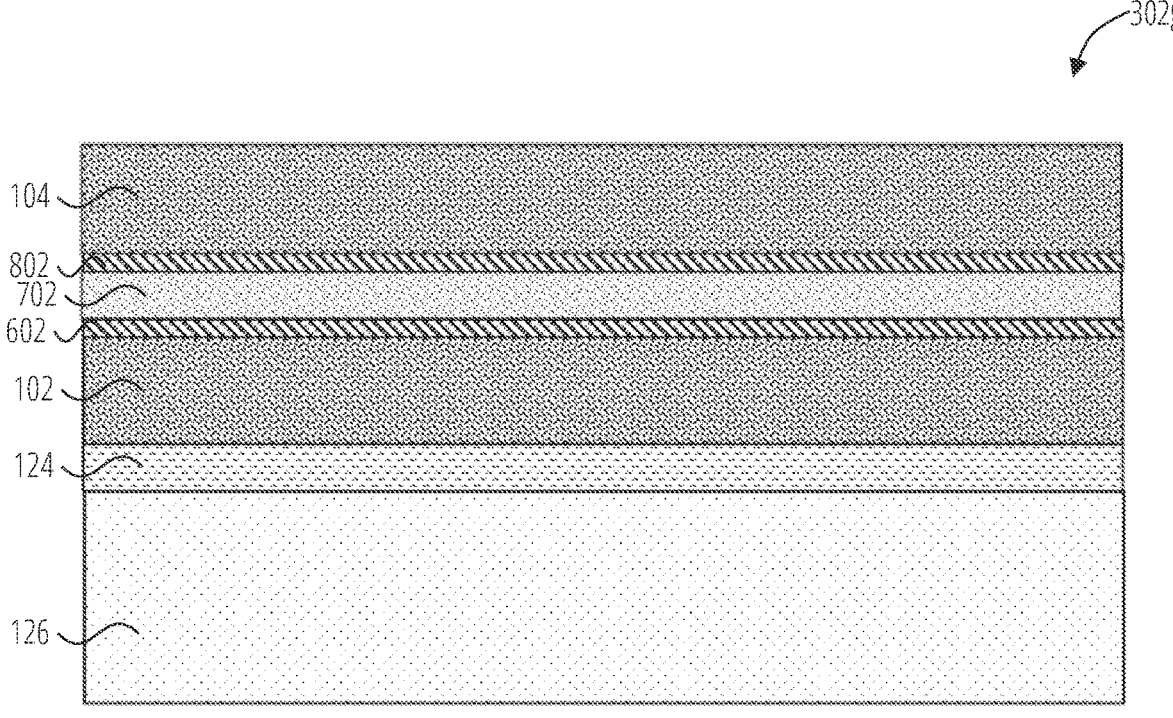
FIG. 9B is a cross-sectional view of the workpiece of FIG. 9A taken through line 9B of FIG. 9A.

FIG. 9B is a cross-sectional view of the workpiece 302g of FIG. 9A taken through line 9B of FIG. 9A. Referring to FIG. 2, FIG. 9A, and FIG. 9B together, at operation 212, the method 200 includes disposing a second polysilicon material 104 on the second sacrificial oxide material 802. In some embodiments, disposing the second polysilicon material 104 on the second sacrificial oxide material 802 includes depositing the second polysilicon material 104 on the second sacrificial oxide material 802 using a CVD process (e.g., using silane).

Figure 10A:
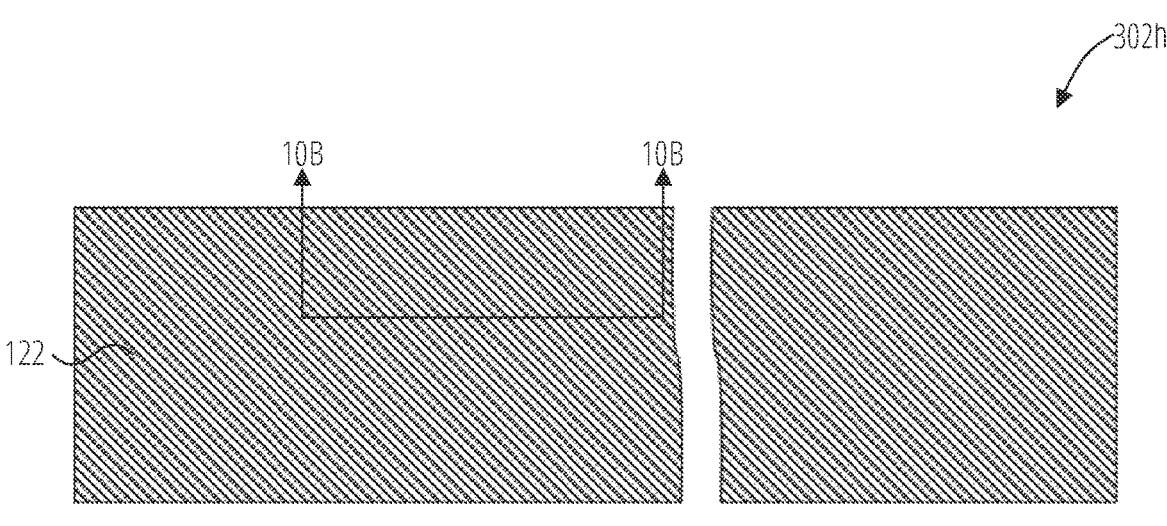
FIG. 10A is a plan view of a workpiece, which is the workpiece of FIG. 9A and FIG. 9B with an insulative material on the second polysilicon material.

FIG. 10A is a plan view of a workpiece 302h, which is the workpiece 302g of FIG. 9A and FIG. 9B with an insulative material 122 on the second polysilicon material 104.

Figure 10B:
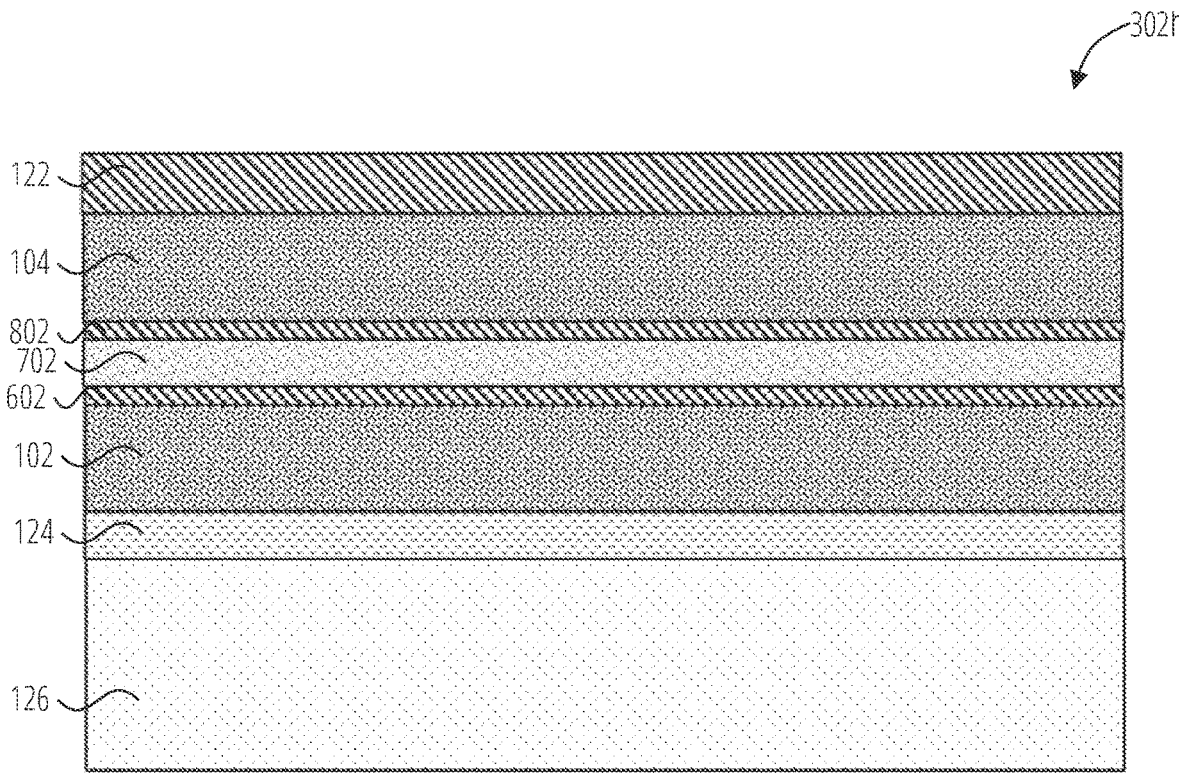
FIG. 10B is a cross-sectional view of the workpiece of FIG. 10A taken through line 10B of FIG. 10A.

FIG. 10B is a cross-sectional view of the workpiece 302h of FIG. 10A taken through line 10B of FIG. 10A. Referring to FIG. 2, FIG. 10A, and FIG. 10B together, at operation 214, the method 200 includes disposing an insulative material 122 on the second polysilicon material 104. In some embodiments, disposing the insulative material 122 on the second polysilicon material 104 includes disposing silicon dioxide on the second polysilicon material 104. In some embodiments, disposing the insulative material 122 on the second polysilicon material 104 includes one or more of depositing the insulative material 122 on the second polysilicon material 104, spinning on the insulative material 122 onto the second polysilicon material 104, or growing the insulative material 122 on the second polysilicon material 104.

Figure 11A:
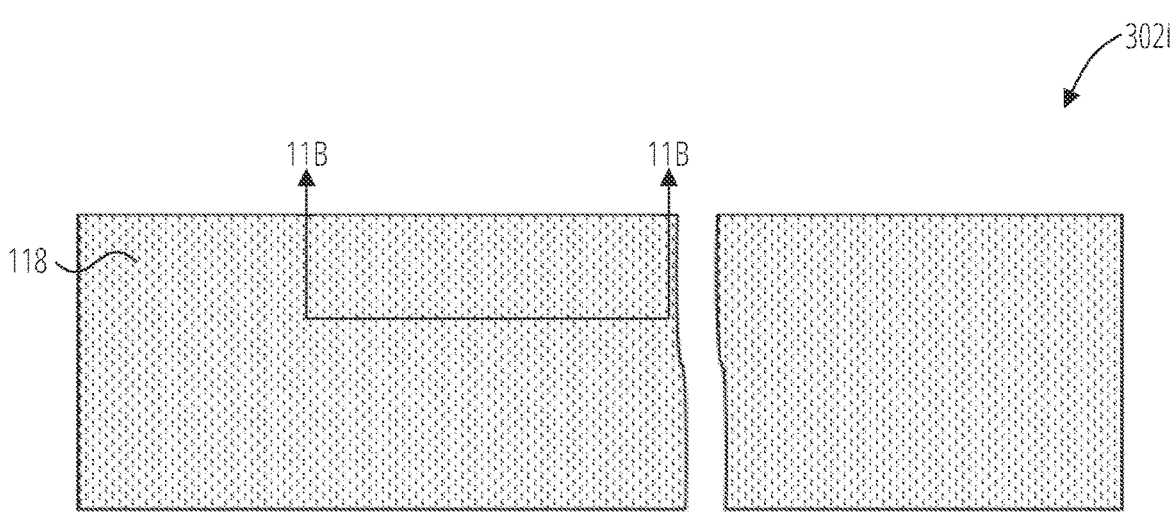
FIG. 11A is a plan view of a workpiece, which is the workpiece of FIG. 10A and FIG. 10B with an access line on the insulative material.

FIG. 11A is a plan view of a workpiece 302*i*, which is the workpiece 302*h* of FIG. 10A and FIG. 10B with an access line 118 on the insulative material 122.

Figure 11B:
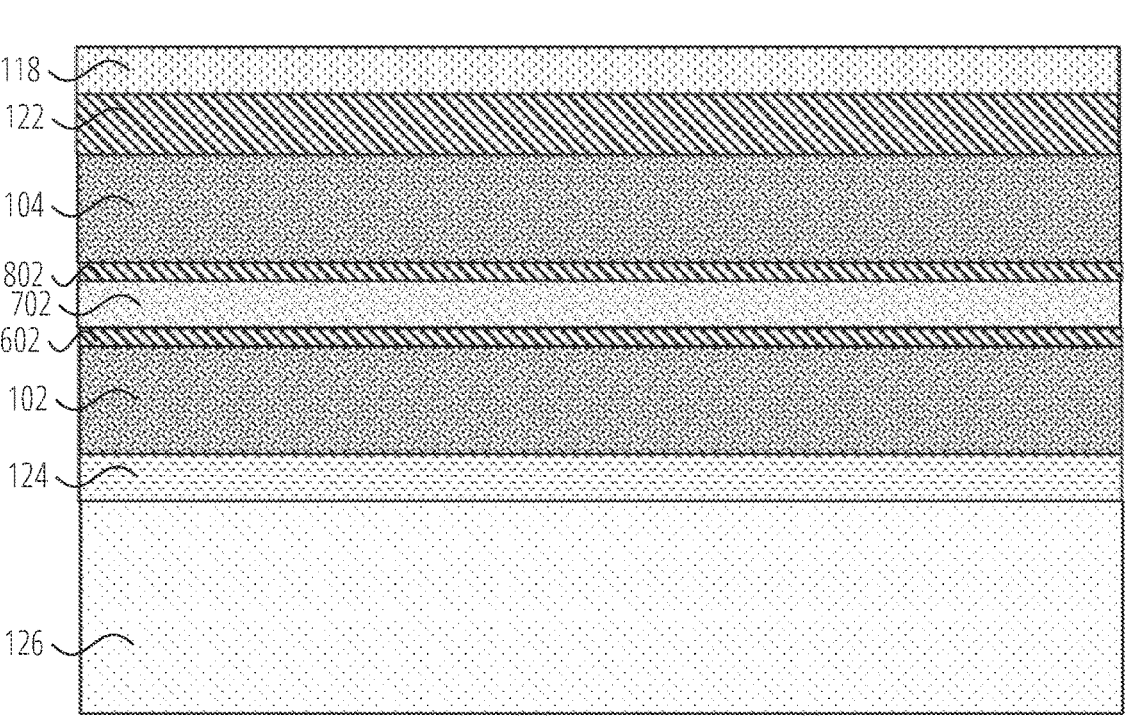
FIG. 11B is a cross-sectional view of the workpiece of FIG. 11A taken through line 11B of FIG. 11A.

FIG. 11B is a cross-sectional view of the workpiece 302*i* of FIG. 11A taken through line 11B of FIG. 11A. Referring to FIG. 2, FIG. 11A, and FIG. 11B together, at operation 216, the method 200 includes disposing an access line 118 on the insulative material 122. Disposing the access line 118 on the insulative material 122 includes disposing a conductive material on the insulative material 122.

Figures 12A, 12B:
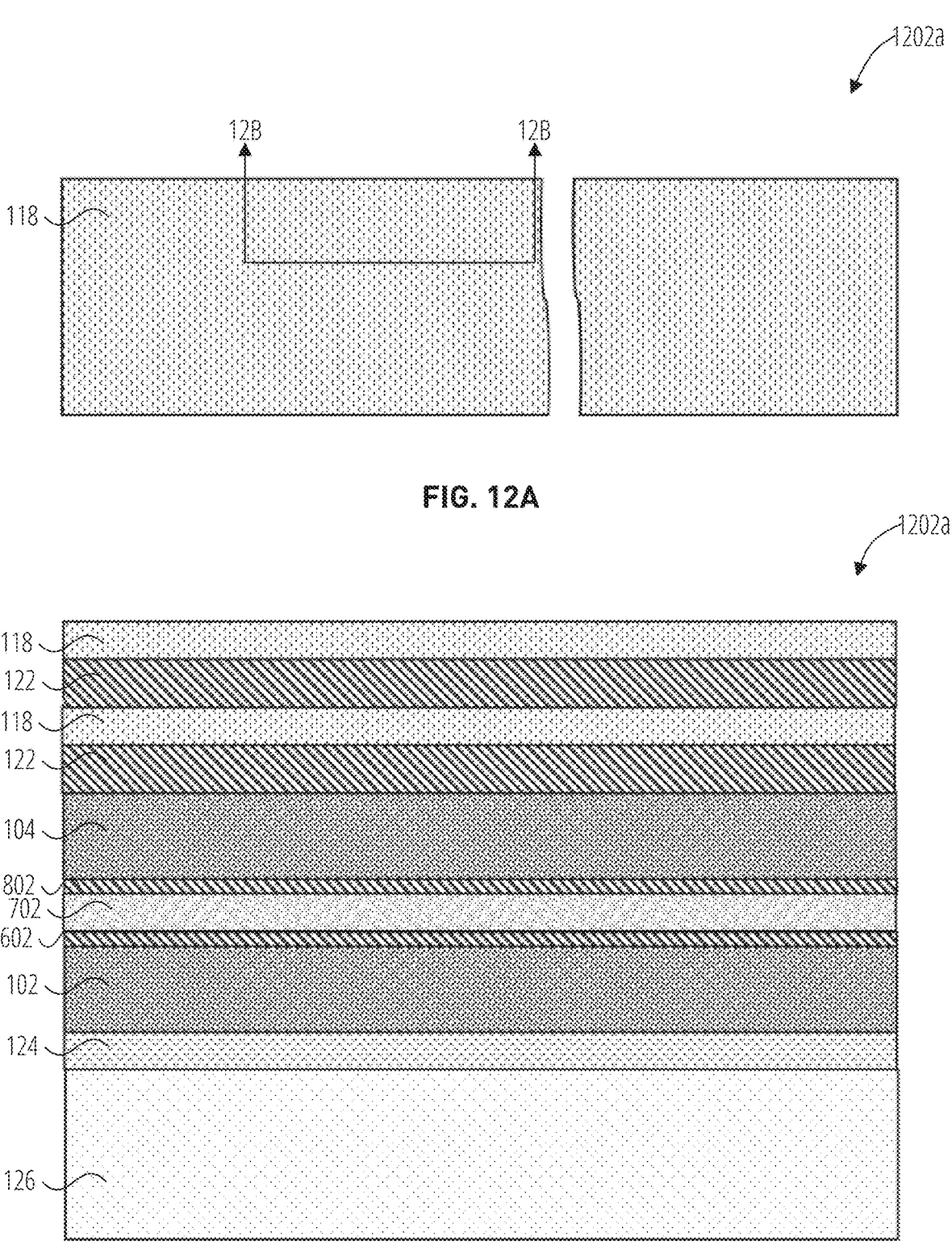
FIG. 12A is a plan view of a stack of materials, which is the workpiece of FIG. 11A and FIG. 11B with an additional insulative material and an additional access line over the access line.
FIG. 12B is a cross-sectional view of the stack of FIG. 12A taken through line 12B of FIG. 12A.

FIG. 12A is a plan view of a stack 1202*a* of materials, which is the workpiece 302*i* of FIG. 11A and FIG. 11B with an additional insulative material 122 and an additional access line 118 over the access line 118.

FIG. 12B is a cross-sectional view of the stack 1202*a* of FIG. 12A taken through line 12B of FIG. 12A. Referring to FIG. 2, FIG. 12A, and FIG. 12B together, at operation 218, the method 200 includes repeating the disposing of the insulative material 122 and the disposing of the access line 118 to form vertically stacked access lines 118 separated by intervening insulative materials 122 over the second polysilicon material 104. Although only two sets (e.g., tiers) of the insulative material 122 and the access line 118 are shown in FIG. 12B, more than two sets of the insulative material 122 and the access line 118 may be disposed, depending on how many memory cells (e.g., the memory cells 110 of FIG. 1B) are desired in each pillar (e.g., the pillars 108 of FIG. 1A and FIG. 1). The number of access lines 118 may be substantially equal to the number of memory cells 110 in each pillar 108 to provide separate access, via the access lines 118, to each of the memory cells 110.

FIG. 13 is a flowchart illustrating a method 1300 of forming pillars 108 defining memory cells 110 in the stack 1202*a* of FIG. 12A and FIG. 12B, according to some embodiments.

FIG. 14A-FIG. 15B illustrate operations of the method 1300 on the stack 1202*a* of materials to form the pillars 108.

Figures 14A, 14B:
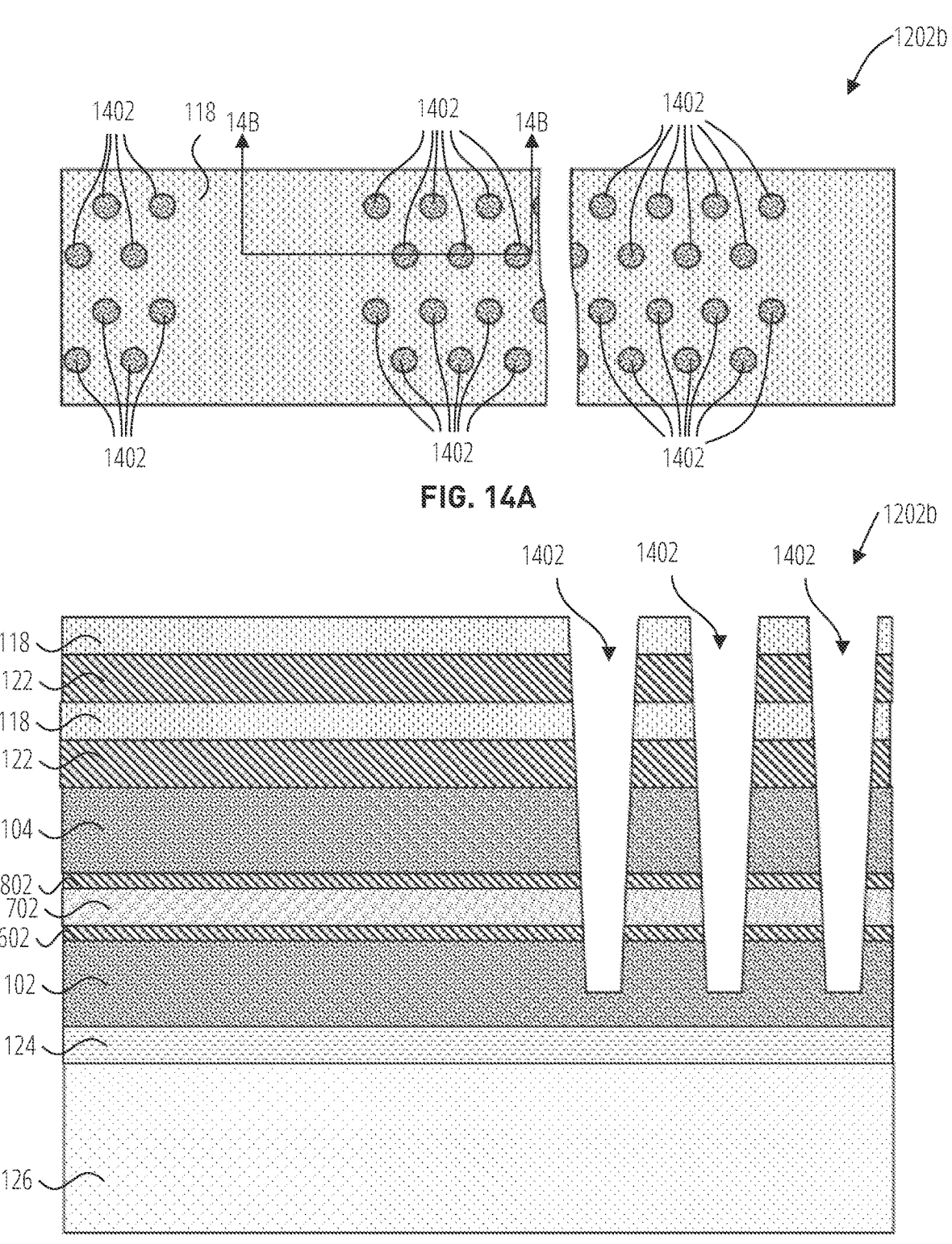
FIG. 14A is a plan view of a stack, which is the stack of FIG. 12A and FIG. 12B with pillar openings formed therein.
FIG. 14B is a cross-sectional view of the stack of FIG. 14A taken through line 14B of FIG. 14A.

FIG. 14A is a plan view of a stack 1202*b*, which is the stack 1202*a* of FIG. 12A and FIG. 12B with pillar openings 1402 formed therein.

FIG. 14B is a cross-sectional view of the stack 1202*b* of FIG. 14A taken through line 14B of FIG. 14A. Referring to FIG. 13, FIG. 14A, and FIG. 14B together, at operation 1302, the method 1300 includes removing portions of the access lines 118, the insulative materials 122, the second polysilicon material 104, the second sacrificial oxide material 802, the sacrificial polysilicon material 702, the first sacrificial oxide material 602, and the first polysilicon material 102 to define pillar openings (e.g., passages) 1402 extending through access lines 118, the insulative materials 122, the second polysilicon material 104, the second sacrificial oxide material 802, the sacrificial polysilicon material 702, the first sacrificial oxide material 602, and into the first polysilicon material 102.

Figures 15A, 15B:
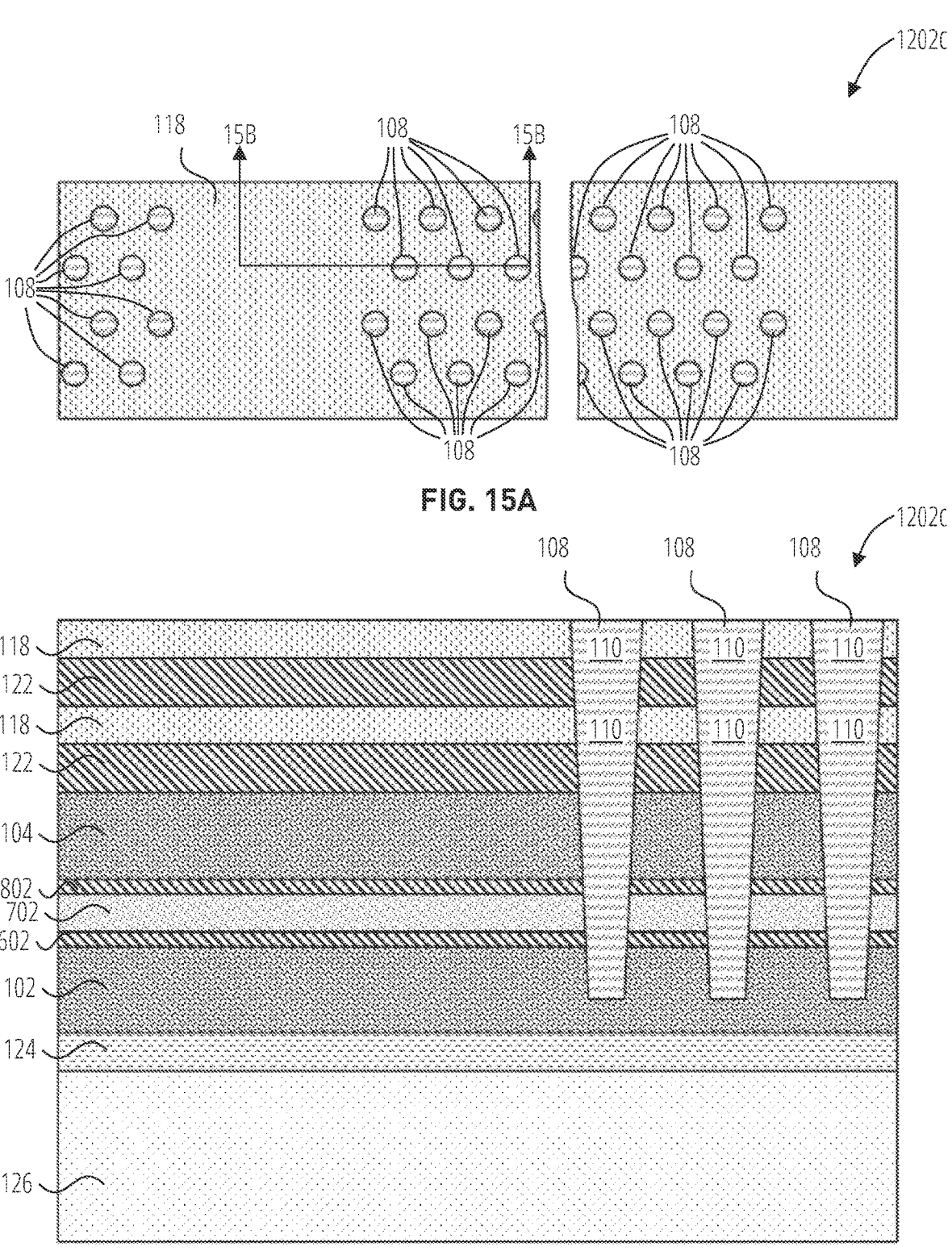
FIG. 15A is a plan view of a stack, which is the stack of FIG. 14A and FIG. 14B with pillars formed in the pillar openings.
FIG. 15B is a cross-sectional view of the stack of FIG. 15A taken through line 15B of FIG. 15A.

FIG. 15A is a plan view of a stack 1202*c*, which is the stack 1202*b* of FIG. 14A and FIG. 14B with pillars 108 formed in the pillar openings 1402.

FIG. 15B is a cross-sectional view of the stack 1202*c* of FIG. 15A taken through line 15B of FIG. 15A. Referring to FIG. 13, FIG. 15A, and FIG. 15B together, at operation 1304, the method 1300 includes forming pillars 108 defining memory cells 110 within the pillar openings 1402. The pillars 108 define the memory cells 110 at intersections between the access lines 118 and the pillars 108. By way of non-limiting example, the memory cells 110 may include MONOS memory cells. While the pillars 108 are illustrated as a single material for simplicity, the pillars 108 include multiple materials including, but not limited to, a charge blocking material, a charge trap material, a tunnel dielectric material, and a channel material. A fill material may be formed in a remaining volume of the pillar openings. The charge blocking material, the charge trap material, the tunnel dielectric material, the channel, and the fill material may be positioned in order from the outermost material to the innermost material relative to an axial centerline of the pillars 108.

FIG. 16 is a flowchart illustrating a method 1600 of manufacturing an integrated circuit device structure (e.g., the integrated circuit device structure 100 of FIG. 1A, without limitation) from the stack 1202*c* of FIG. 15A and FIG. 15B, according to some embodiments.

FIG. 17A through FIG. 23B illustrate operations of the method 1600 on the stack 1202*c* to manufacture the integrated circuit device structure 100 of FIG. 1A and FIG. 1B.

Figures 17A, 17B:
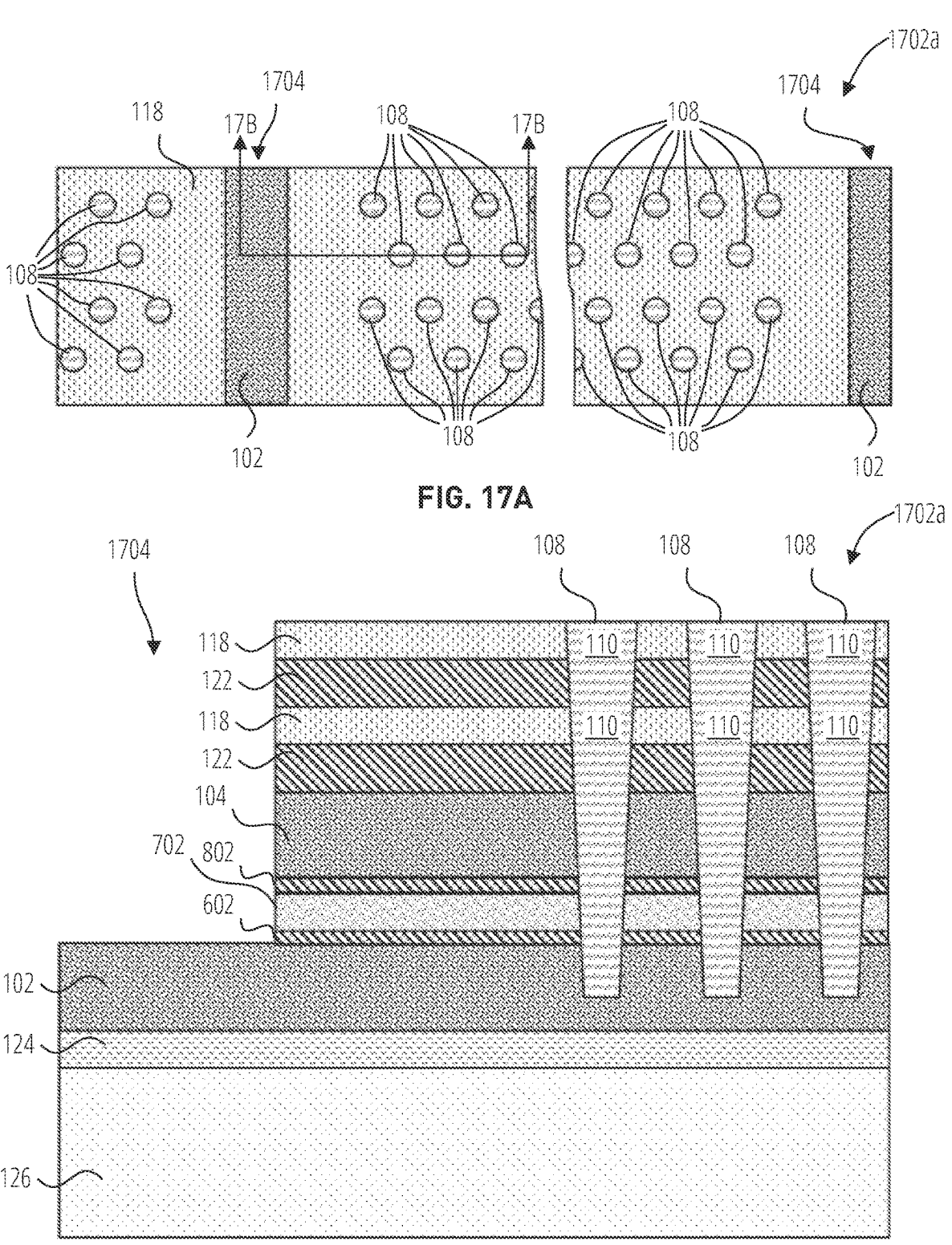
FIG. 17A is a plan view of a workpiece, which is the stack of FIG. 15A and FIG. 15B with trenches formed therein.
FIG. 17B is a cross-sectional view of the workpiece of FIG. 17A taken through line 17B of FIG. 17A.

FIG. 17A is a plan view of a workpiece 1702*a*, which is the stack 1202*c* of FIG. 15A and FIG. 15B with trenches 1704 formed therein.

FIG. 17B is a cross-sectional view of the workpiece 1702*a* of FIG. 17A taken through line 17B of FIG. 17A. Referring to FIG. 16, FIG. 17A, and FIG. 17B together, at operation 1602, the method 1600 includes removing portions of the access lines 118, the insulative materials 122, the second polysilicon material 104, the second sacrificial oxide material 802, the sacrificial polysilicon material 702, and the first sacrificial oxide material 602 to define a trench 1704 extending through the access lines 118, the insulative materials 122, the second polysilicon material 104, the second sacrificial oxide material 802, the sacrificial polysilicon material 702, and the first sacrificial oxide material 602.

The trenches 1704 provide access to the first sacrificial oxide material 602, the sacrificial polysilicon material 702, and the second sacrificial oxide material 802 to enable removal of the first sacrificial oxide material 602, the sacrificial polysilicon material 702, and the second sacrificial oxide material 802. The trench 1704 also provides access to the remaining space previously occupied by these sacrificial materials to enable the remaining space to be filled with the intervening polysilicon material 106 of FIG. 1B, as will be discussed below.

Figures 18A, 18B:
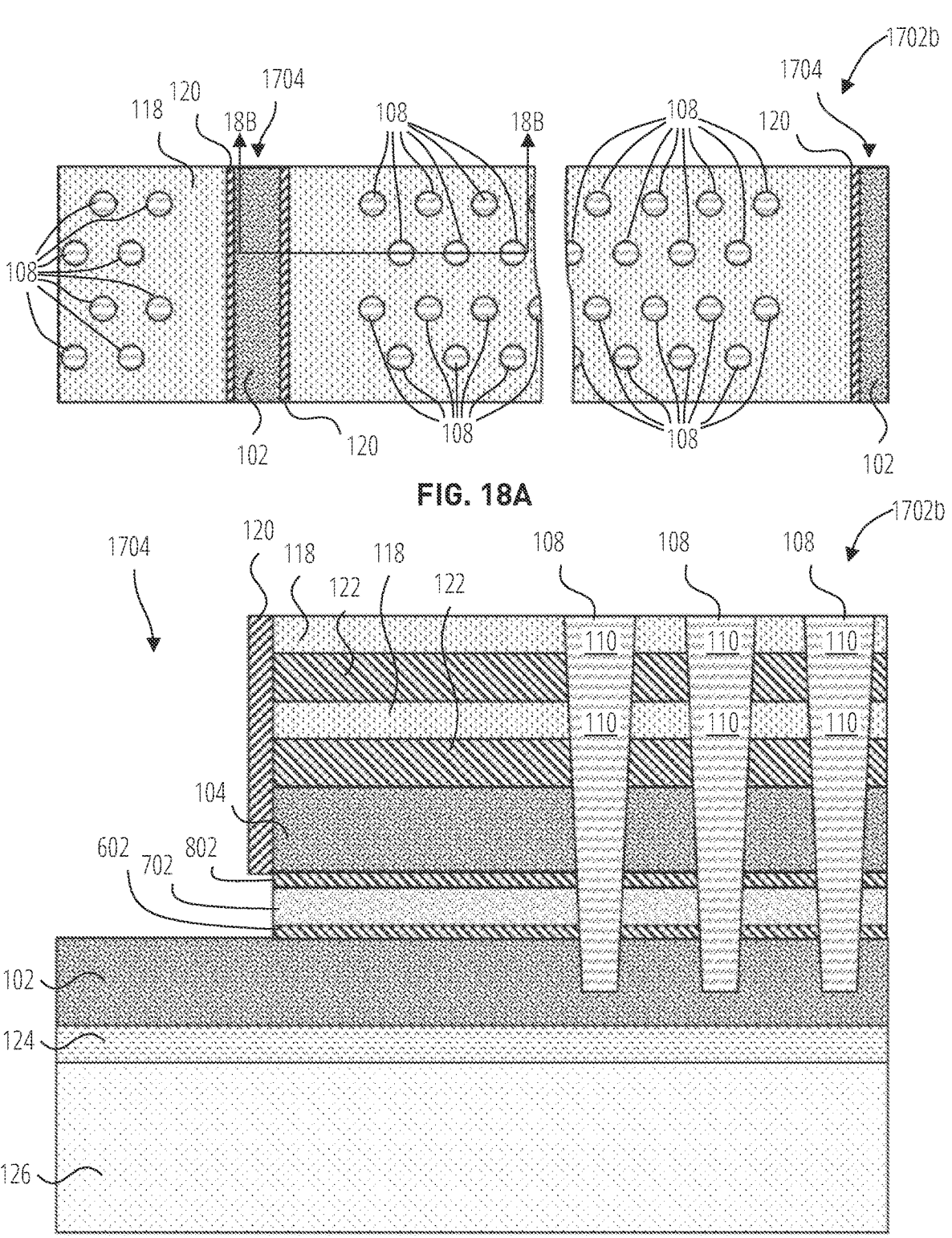
FIG. 18A is a plan view of a workpiece, which is the workpiece of FIG. 17A and FIG. 17B with one or more liner materials in the trenches.
FIG. 18B is a cross-sectional view of the workpiece of FIG. 18A taken through line 18B of FIG. 18A.

FIG. 18A is a plan view of a workpiece 1702*b*, which is the workpiece 1702*a* of FIG. 17A and FIG. 17B with one or more liner materials 120 in the trenches 1704.

FIG. 18B is a cross-sectional view of the workpiece 1702*b* of FIG. 18A taken through line 18B of FIG. 18A. Referring to FIG. 16, FIG. 18A, and FIG. 18B together, at operation 1604, the method 1600 includes forming one or more liner materials 120 on the access lines 118, the insulative materials 122, and the second polysilicon material 104 within the trenches 1704. As will be discussed with reference to operation 1608 and FIG. 20A and FIG. 20B, the first sacrificial oxide material 602 and the second sacrificial oxide material 802 will be selectively removed. The one or more liner materials 120 protect the insulative materials 122 from removal during removal of the first sacrificial oxide material 602 and the second sacrificial oxide material 802. Also, as will be discussed with reference to operation 1606 and FIG. 19A and FIG. 19B, the sacrificial polysilicon material 702 will be removed. The one or more liner materials 120 also protect the access lines 118 from removal during removal of the sacrificial polysilicon material 702. By forming the first sacrificial oxide material 602, the sacrificial polysilicon material 702, and the second sacrificial oxide material 802 from materials that are selectively removable (e.g., selectively etchable) relative to one another, the first sacrificial oxide material 602, the sacrificial polysilicon material 702, and the second sacrificial oxide material 802 may be removed as desired.

Figures 19A, 19B:
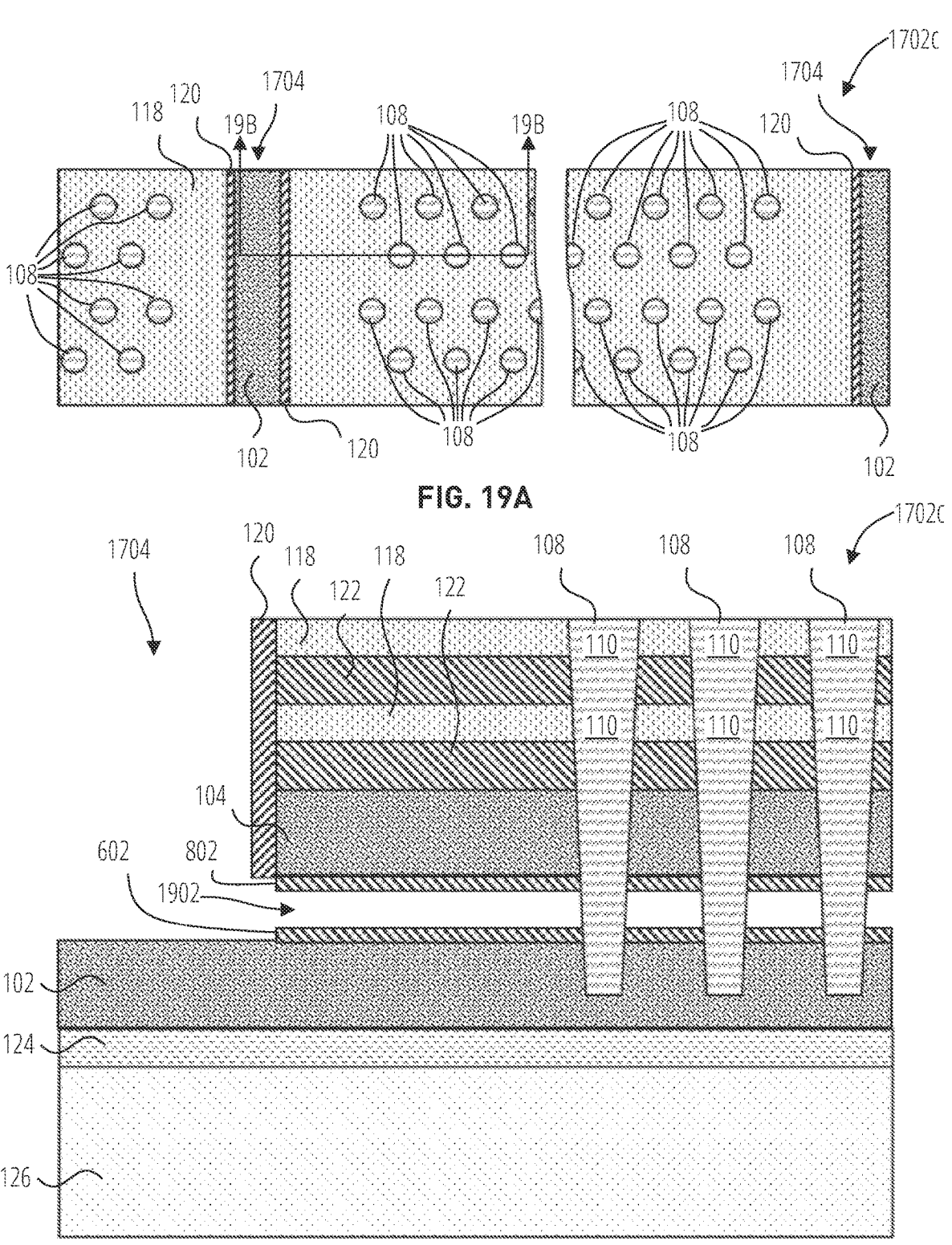
FIG. 19A is a plan view of a workpiece, which is the workpiece of FIG. 18A and FIG. 18B with the sacrificial polysilicon material removed.
FIG. 19B is a cross-sectional view of the workpiece of FIG. 19A taken through line 19B of FIG. 19A.

FIG. 19A is a plan view of a workpiece 1702c, which is the workpiece 1702b of FIG. 18A and FIG. 18B with the sacrificial polysilicon material 702 removed.

FIG. 19B is a cross-sectional view of the workpiece 1702c of FIG. 19A taken through line 19B of FIG. 19A. Referring to FIG. 16, FIG. 19A, and FIG. 19B together, at operation 1606, the method 1600 includes selectively removing the sacrificial polysilicon material 702 without substantially removing the first sacrificial oxide material 602 and the second sacrificial oxide material 802. In some embodiments, a wet chemical etch process may be used to remove the sacrificial polysilicon material 702. In some embodiments, a vapor etch (e.g., a tetramethyl ammonium hydroxide (TMAH) etch) selective for the polysilicon material may be used to remove the sacrificial polysilicon material 702. With the one or more liner materials 120 protecting the access lines 118 and the insulative materials 122, the removal of the sacrificial polysilicon material 702 may not substantially remove the access lines 118 and the insulative materials 122.

As will be apparent from FIG. 19B, removal of the sacrificial polysilicon material 702 at operation 1606 may leave a gap 1902 between the second sacrificial oxide material 802 and the first sacrificial oxide material 602. The pillars 108, however, provide mechanical support to the second sacrificial oxide material 802, the second polysilicon material 104, the insulative materials 122, and the access lines 118 to maintain the second sacrificial oxide material 802, the second polysilicon material 104, the insulative materials 122, and the access lines 118 separated from the first sacrificial oxide material 602.

Figures 20A, 20B:
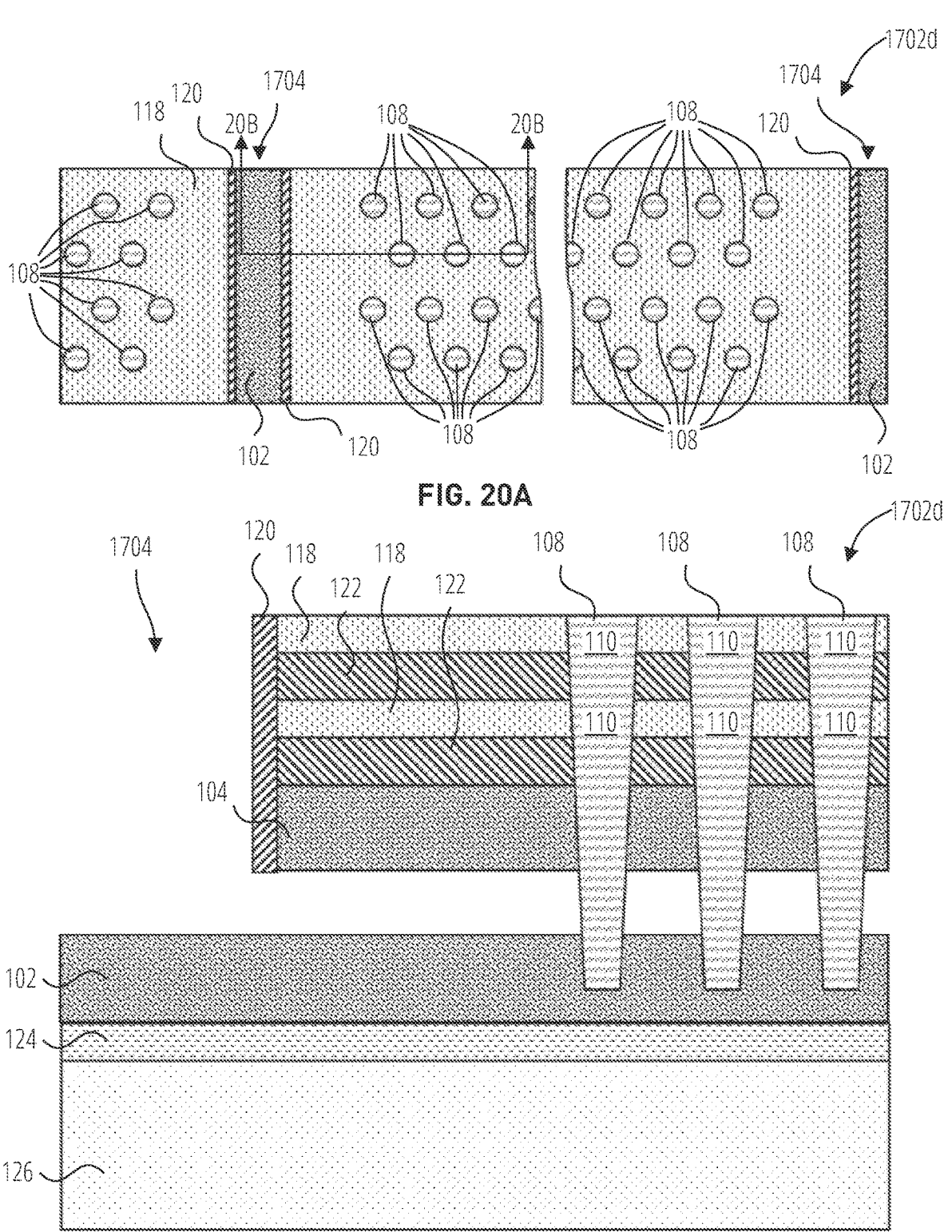
FIG. 20A is a plan view of a workpiece, which is the workpiece 1702c of FIG. 19A and FIG. 19B with the first sacrificial oxide material and the second sacrificial oxide material removed.
FIG. 20B is a cross-sectional view of the workpiece of FIG. 20A taken through line 20B of FIG. 20A.

FIG. 20A is a plan view of a workpiece 1702d, which is the workpiece 1702c of FIG. 19A and FIG. 19B with the first sacrificial oxide material 602 and the second sacrificial oxide material 802 removed.

FIG. 20B is a cross-sectional view of the workpiece 1702d of FIG. 20A taken through line 20B of FIG. 20A. Referring to FIG. 16, FIG. 20A, and FIG. 20B together, at operation 1608, the method 1600 includes removing the first sacrificial oxide material 602 and the second sacrificial oxide material 802. An etch process may be used to remove the first sacrificial oxide material 602 and the second sacrificial oxide material 802 (e.g., an etch process selective to etching oxide material and does not substantially etch polysilicon material).

After removing the sacrificial polysilicon material 702, the first sacrificial oxide material 602, and the second sacrificial oxide material 802, portions of cell films of the pillars 108 between the first polysilicon material 102 and the second polysilicon material 104 are exposed. Exposed portions of the charge blocking material, the charge trap material, and the tunnel dielectric material are removed sequentially (e.g., in order from the outermost material to the innermost material) to expose the underlying channel material of the pillars 108. The portions of the charge blocking material, the charge trap material, and the tunnel dielectric material of the pillars 108 are removed by conventional techniques. Remaining portions of the charge blocking material, the charge trap material, and the tunnel dielectric material are laterally adjacent to the first polysilicon material 102 and the second polysilicon material 104 while the channel material extends continuously from the first polysilicon material 102 to the second polysilicon material 104.

Figures 21A, 21B:
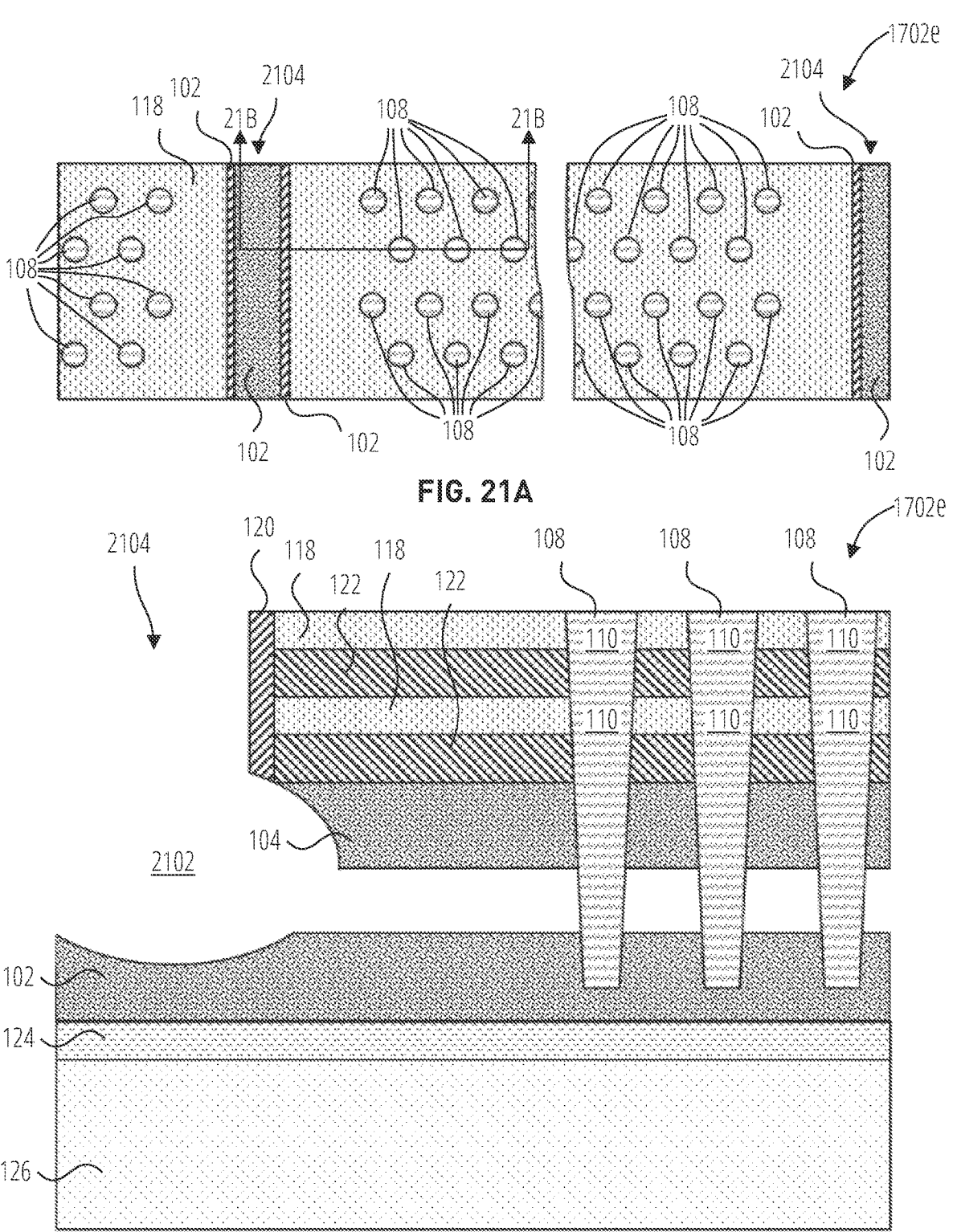
FIG. 21A is a plan view of a workpiece, which is the workpiece of FIG. 20A and FIG. 20B with portions of the first polysilicon material and the second polysilicon material removed in the trenches.
FIG. 21B is a cross-sectional view of the workpiece of FIG. 21A taken through line 21B of FIG. 21A.

FIG. 21A is a plan view of a workpiece 1702e, which is the workpiece 1702d of FIG. 20A and FIG. 20B with portions of the first polysilicon material 102 and the second polysilicon material 104 removed in the trenches 1704 to form expanded trenches 2104.

FIG. 21B is a cross-sectional view of the workpiece 1702e of FIG. 21A taken through line 21B of FIG. 21A. Referring to FIG. 16, FIG. 21A, and FIG. 21B, at operation 1610, the method 1600 includes removing, using an isotropic etch process, portions of the first polysilicon material 102 and the second polysilicon material 104 in the trenches 1704 to form expanded trenches 2104. As illustrated in FIG. 21B, the isotropic etch process may leave a bulbous-shaped opening 2102 in the bottom of the expanded trench 2104. This bulbous-shaped opening 2102 may extend downward into the first polysilicon material 102, laterally into the first polysilicon material 102 and the second polysilicon material 104, and may optionally remove a portion of the one or more liner materials 120. The bulbous-shaped opening may be defined by an upper horizontal surface of the first polysilicon material 102, a lower surface of the one or more liner materials 120, and an exposed surface of the second polysilicon material 104. One or more of the surfaces defining the bulbous-shaped opening 2102 may be curved, as shown in FIG. 21B. However, one or more of the surfaces may be planar.

As also apparent in FIG. 21B, the distance between the first polysilicon material 102 and the second polysilicon material 104 may be wider than the gap 1902 between the first sacrificial oxide material 602 and the second sacrificial oxide material 802, as illustrated in FIG. 19B, due to the removal of the first sacrificial oxide material 602 and the second sacrificial oxide material 802. The distance between the first polysilicon material 102 and the second polysilicon material 104 may be defined by a lower horizontal surface of the second polysilicon material 104 and the upper horizontal surface of the first polysilicon material 102. Proximal to the pillars 108, exposed sidewalls of the pillars 108 (e.g., exposed sidewalls of the channel material) may define the distance between the first polysilicon material 102 and the second polysilicon material 104. Again, however, the pillars 108 mechanically support the second polysilicon material 104, the insulative materials 122, and the access lines 118 over the first polysilicon material 102.

Figures 22A, 22B:
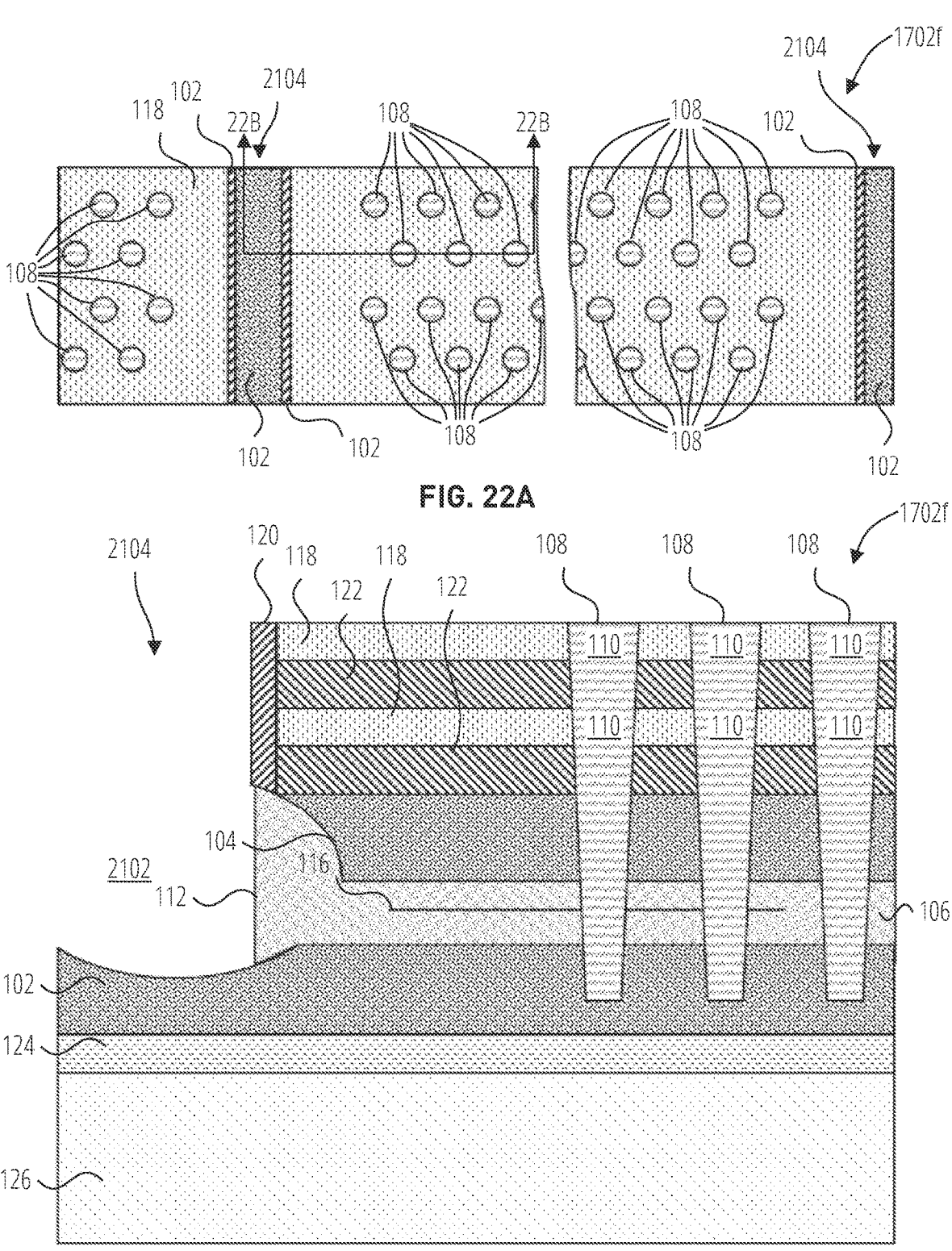
FIG. 22A is a plan view of a workpiece, which is the workpiece of FIG. 21A and FIG. 21B with an intervening polysilicon material formed between the first polysilicon material and the second polysilicon material.
FIG. 22B is a cross-sectional view of the workpiece of FIG. 22A taken through line 22B of FIG. 22A.

FIG. 22A is a plan view of a workpiece 1702f, which is the workpiece 1702e of FIG. 21A and FIG. 21B with an intervening polysilicon material 106 present between the first polysilicon material 102 and the second polysilicon material 104.

FIG. 22B is a cross-sectional view of the workpiece 1702f of FIG. 22A taken through line 22B of FIG. 22A. Referring to FIG. 16, FIG. 22A, and FIG. 22B together, at operation 1612, the method 1600 includes forming an intervening polysilicon material 106 between the first polysilicon material 102 and the second polysilicon material 104. Forming the intervening polysilicon material 106 between the first polysilicon material 102 and the second polysilicon material 104 may include growing or depositing the intervening polysilicon material 106.

During formation of the intervening polysilicon material 106, surfaces of new polysilicon material may form from both the bottom surface of the second polysilicon material 104 and from the top surface of the first polysilicon material 102. When these surfaces of the new polysilicon material meet within the intervening polysilicon material 106 a seam 116 may be formed in some instances. The seam 116 may be present through a majority of the intervening polysilicon material, in one or more isolated areas of the intervening polysilicon material, or no seam 116 may be present. The new polysilicon material may also fill a portion of the bulbous-shaped opening 2102 in the bottom of the trench 2104. Accordingly, the intervening polysilicon material 106 may be thicker at the distal edge 112 of the intervening polysilicon material 106 away from the pillars 108. A thickness of the intervening polysilicon material 106 may decrease (e.g., taper) from a thicker portion at the distal edge 112 to a thinner portion proximal to the pillars 108, as illustrated in FIG. 22B. The thickness of the intervening polysilicon material 106 may decrease according to curved surfaces defined by the first polysilicon material 102 and second polysilicon material 104, as shown in FIG. 22B, or according to substantially planar surfaces (not shown in FIG. 22B).

The thicker portion of the intervening polysilicon material 106 may bury the seam 116 behind the polysilicon material of the intervening polysilicon material 106 at the distal edge 112. An entrance to the seam 116 may be sealed and the seam 116 may not be exposed to chemicals during further processing of the workpiece 1702f. Accordingly, the chances of the chemicals attacking at the seam 116, which may open or widen the seam 116 and possibly disconnect one or more of the pillars 108 from the source terminal (e.g., the source terminal 128 of FIG. 1), may be reduced.

Figures 23A, 23B:
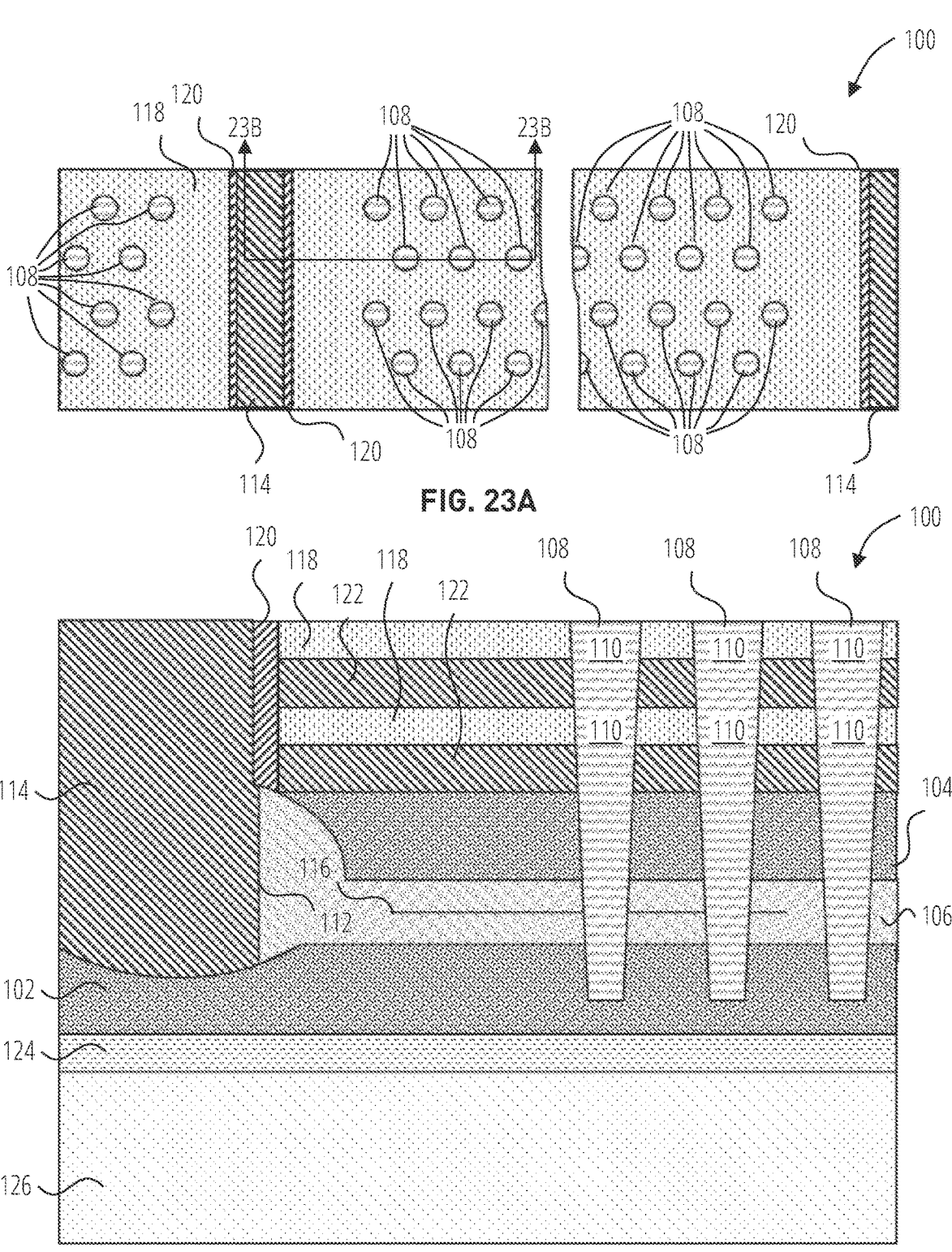
FIG. 23A is a plan view of the integrated circuit device structure of FIG. 1A and FIG. 1B, which is the workpiece of FIG. 21A and FIG. 21B with one or more insulative materials disposed in the trenches.
FIG. 23B is a cross-sectional view of the integrated circuit device structure of FIG. 1A, FIG. 1B, and FIG. 23A taken through line 23B of FIG. 23A.

FIG. 23A is a plan view of the integrated circuit device structure 100 of FIG. 1A and FIG. 1B, which is the workpiece 1702f of FIG. 21A and FIG. 21B with one or more insulative materials 114 disposed in the trenches 2104.

FIG. 23B is a cross-sectional view of the integrated circuit device structure 100 of FIG. 1A, FIG. 1B, and FIG. 23A taken through line FIG. 23B of FIG. 23A. Referring to FIG. 16, FIG. 23A, and FIG. 23B together, at operation 1614, the method 1600 includes disposing one or more insulative materials 114 in the trenches 2104. In some embodiments, disposing the one or more insulative materials 114 in the trenches 2104 includes alternatingly disposing an oxide (e.g., $SiO_2$) and a nitride (e.g., $Si_3N_4$). Since the intervening polysilicon material 106 and the one or more insulative materials 114 fill what was a bulbous-shaped opening 2102 at the bottom of the trench 2104 (FIG. 21), an interface between the one or more insulative materials 114 and the first polysilicon material 102 may be substantially curved in some instances.

Figure 24:
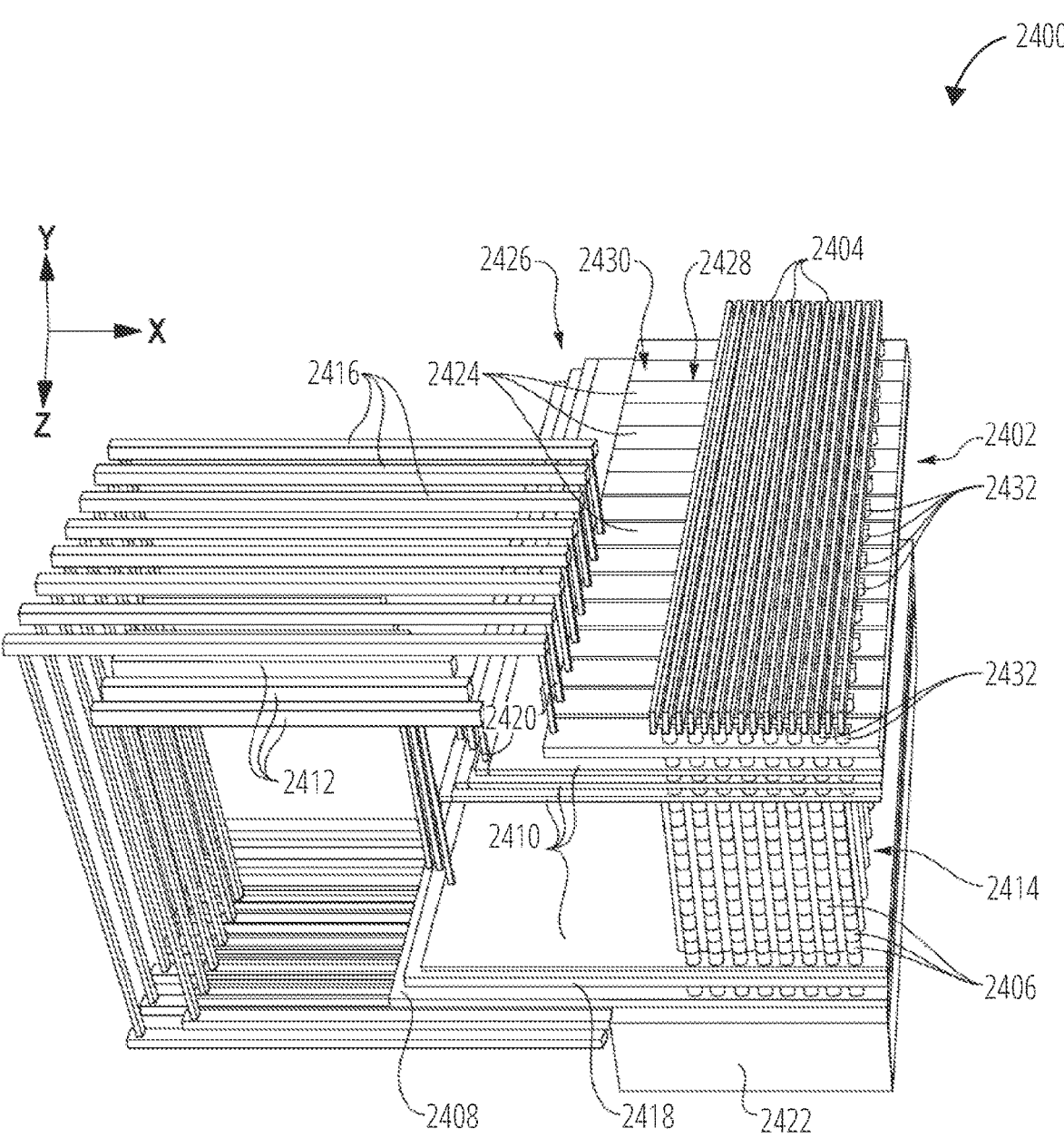
FIG. 24 illustrates a partial cutaway perspective view of a portion of a microelectronic device (e.g., a memory device, such as a dual deck 3D NAND Flash memory device) including a microelectronic device structure, according to some embodiments.

FIG. 24 illustrates a partial cutaway perspective view of a portion of a microelectronic device 2400 (e.g., a memory device, such as a dual deck 3D NAND Flash memory device) including a microelectronic device structure 2402. The microelectronic device structure 2402 may include structures substantially similar to those discussed above with reference to the integrated circuit device structure 100 of FIG. 1A and FIG. 1B. As shown in FIG. 24, the microelectronic device structure 2402 includes conductive structures 2410 similar to the access lines 118 of FIG. 1A and FIG. 1B; vertical strings 2414 similar to the pillars 108 of FIG. 1A and FIG. 1B; memory cells 2406 similar to the memory cells 110 of FIG. 1B; and a source tier 2408 similar to the source terminal 128 of FIG. 1B.

A stair step structure 2426 defines contact regions for connecting access lines 2412 to conductive structures 2410 similar to the access lines 118 of FIG. 1A and FIG. 1B. For example, vertical conductive contacts 2420 electrically connect the access lines 2412 to the conductive structures 2410. Since the access lines 2412 are electrically connected to the conductive structures 2410, the conductive structures 2410 may be considered extensions to the access lines 2412, and may therefore be referred to interchangeably as access lines 2412. The microelectronic device structure 2402 may include vertical strings 2414 of memory cells 2406 (e.g., the memory cells 110 defined by the pillars 108 of FIG. 1), which may be electrically connected to each other in series. The vertical strings 2414 may extend vertically (e.g., in the Z-direction) and orthogonally to conductive lines and structures, such as bitlines 2404, the conductive structures 2410, the access lines 2412, first select gates 2424 (e.g., upper select gates, drain-side select gates (SGDs)), select lines 2416, and a second select gate 2418 (e.g., a lower select gate, a source-side select gate (SGS)). The first select gates 2424 may be horizontally divided (e.g., in the Y-direction) into multiple blocks 2430 horizontally separated (e.g., in the Y-direction) from one another by slot structures 2428.

Vertical conductive contacts 2420 may electrically connect components to each other as shown. For example, the select lines 2416 may be electrically connected to the first select gates 2424 and the access lines 2412 may be electrically connected to the conductive structures 2410. The microelectronic device 2400 may also include a control unit 2422 positioned under the memory array, which may include control logic devices configured to control various operations of other features (e.g., the vertical strings 2414 of memory cells 2406) of the microelectronic device 2400. By way of non-limiting example, the control unit 2422 may include one or more (e.g., each) of charge pumps (e.g., VccP charge pumps, VNEGWL charge pumps, DVC2 charge pumps), delay-locked loop (DLL) circuitry (e.g., ring oscillators), Vdd regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 2422 may be electrically connected to the bitlines 2404, the source tier 2408, the access lines 2412, the first select gates 2424, and the second select gates 2418, for example. In some embodiments, the control unit 2422 includes CMOS (complementary metal-oxide-semiconductor) circuitry. In such embodiments, the control unit 2422 may be characterized as having a "CMOS under Array" ("CuA") configuration.

The first select gates 2424 may extend horizontally in a first direction (e.g., the X-direction) and may be electrically connected to respective first groups of vertical strings 2414 of memory cells 2406 at a first end (e.g., an upper end) of the vertical strings 2414. The second select gate 2418 may be formed in a substantially planar configuration and may be electrically connected to the vertical strings 2414 at a second, opposite end (e.g., a lower end) of the vertical strings 2414 of memory cells 2406.

The bitlines 2404 may extend horizontally in a second direction (e.g., in the Y-direction) that is at an angle (e.g., perpendicular) to the first direction in which the first select gates 2424 extend. The bitlines 2404 may be electrically connected to respective second groups of the vertical strings 2414 at the first end (e.g., the upper end) of the vertical strings 2414. A first group of vertical strings 2414 electrically connected to a respective first select gate 2424 may share a particular vertical string 2414 with a second group of vertical strings 2414 electrically connected to a respective bitline 2404. Thus, a particular vertical string 2414 may be selected at an intersection of a particular first select gate 2424 and a particular bitline 2404. Accordingly, the first select gates 2424 may be used for selecting memory cells 2406 of the vertical strings 2414 of memory cells 2406.

The conductive structures 2410 (e.g., word lines, word line plates) may extend in respective horizontal planes. The conductive structures 2410 may be stacked vertically, such that each conductive structure 2410 is electrically connected to all of the vertical strings 2414 of memory cells 2406, and the vertical strings 2414 of the memory cells 2406 extend vertically through the stack of conductive structures 2410. The conductive structures 2410 may be vertically separated from one another by insulative material (e.g., the insulative materials 122 of FIG. 1*i*). The conductive structures 2410 may be electrically connected to or may form control gates for the memory cells 2406. Each conductive structure 2410 may be electrically connected to one memory cell 2406 of a particular vertical string 2414 of memory cells 2406.

The first select gates 2424 and the second select gates 2418 may operate to select a particular vertical string 2414 of the memory cells 2406 between a particular bitline 2404 and the source tier 2408. Thus, a particular memory cell 2406 may be selected and electrically connected to a bitline 2404 by operation of (e.g., by selecting) the appropriate first select gate 2424, second select gate 2418, and conductive structure 2410 that are electrically connected to the particular memory cell 2406.

The stair step structure 2426 may be configured to provide electrical connection between the access lines 2412 and the conductive structure 2410 through the vertical conductive contacts 2420. In other words, a particular level of the conductive structure 2410 may be selected via an access line 2412 in electrical communication with a respective vertical conductive contact 2420 in electrical communication with the particular conductive structure 2410.

The bitlines 2404 may be electrically connected to the vertical strings 2414 through conductive contact structures 2432.

Figure 25:
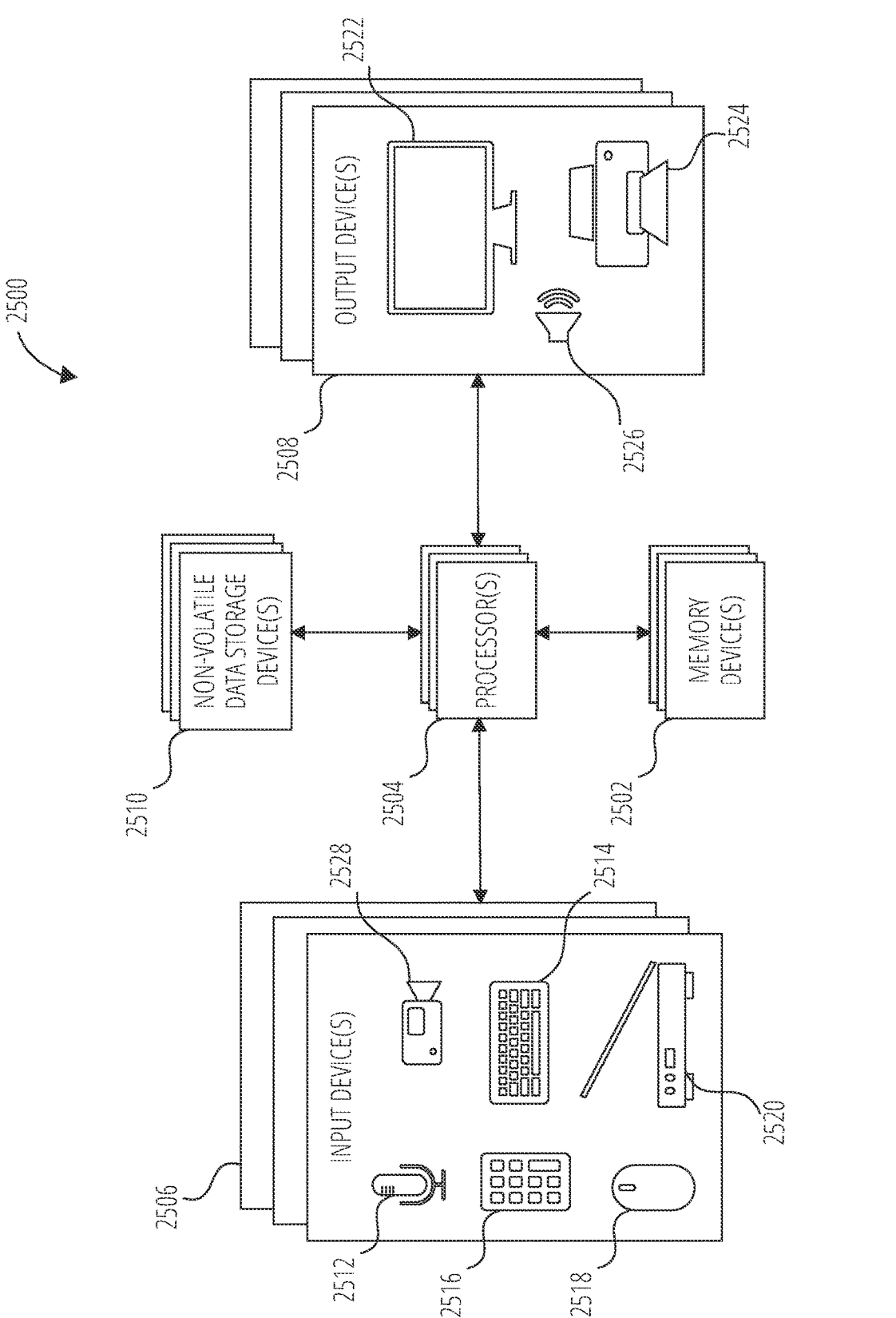
FIG. 25 is a block diagram of a computing system, according to some embodiments.

FIG. 25 is a block diagram of a computing system 2500, according to some embodiments. The computing system 2500 includes one or more processors 2504 operably coupled to one or more memory devices 2502, one or more non-volatile data storage devices 2510, one or more input devices 2506, and one or more output devices 2508. In some embodiments, the computing system 2500 includes a personal computer (PC) such as a desktop computer, a laptop computer, a tablet computer, a mobile computer (e.g., a smartphone, a personal digital assistant (PDA)), a network server, or other computer device.

In some embodiments, the one or more processors 2504 include a central processing unit (CPU) or other processor configured to control the computing system 2500. In some embodiments, the one or more memory devices 2502 include random access memory (RAM), such as volatile data storage (e.g., dynamic RAM (DRAM) static RAM (SRAM)). In some embodiments, the one or more non-volatile data storage devices 2510 include a hard drive, a solid state drive, Flash memory, erasable programmable read only memory (EPROM), other non-volatile data storage devices, or any combination thereof. In some embodiments, the one or more input devices 2506 include a keyboard 2514, a pointing device 2518 (e.g., a mouse, a track pad), a microphone 2512, a keypad 2516, a scanner 2520, a camera 2528, other input devices, or any combination thereof. In some embodiments, the output devices 2508 include an electronic display 2522, a speaker 2526, a printer 2524, other output devices, or any combination thereof.

The memory devices 2502 include one or more of the integrated circuit device structures 100 of FIG. 1A and FIG. 1B. In some embodiments, the memory devices 2502 may be manufactured using one or more of the method 200 of FIG. 2, the method 1300 of FIG. 13, or the method 1600 of FIG. 16. The one or more memory devices 2502 include pillars (e.g., the pillars 108 of FIG. 1A and FIG. 1B) defining memory cells (e.g., the memory cell 110 of FIG. 1B) and a source terminal (e.g., the source terminal 128 of FIG. 1). The pillars are electrically connected to the source terminal. The source terminal includes an intervening polysilicon material (e.g., the intervening polysilicon material 106 of FIG. 1B) that is thicker at a distal edge (e.g., the distal edge 112 of FIG. 1B) away from the pillars than at a proximal portion (e.g., the proximal portion 130 of FIG. 1B) at the pillars.

In some embodiments, the intervening polysilicon material decreases in thickness (e.g., is tapered) from the distal edge toward the pillars. In some embodiments, the source terminal includes a first polysilicon material (e.g., the first polysilicon material 102 of FIG. 1B) and a second polysilicon material (e.g., the second polysilicon material 104 of FIG. 1*i*), and the intervening polysilicon material is between the first polysilicon material and the second polysilicon material. In some embodiments, the source terminal includes a seam (e.g., the seam 116 of FIG. 1B) within the intervening polysilicon material and defined by the intervening polysilicon material. The seam is sealed from the distal edge by a thicker portion of the intervening polysilicon material at the distal edge.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
a first polysilicon material;
a second polysilicon material offset from the first polysilicon material;
an intervening polysilicon material between the first polysilicon material and the second polysilicon material;
pillars defining memory cells, the pillars extending through the second polysilicon material and a proximal portion of the intervening polysilicon material into the first polysilicon material; and
one or more insulative materials at a distal edge of the intervening polysilicon material, the intervening polysilicon material thicker at the distal edge than at the pillars.

2. The apparatus of claim 1, wherein the one or more insulative materials extend at least partially into the first polysilicon material.

3. The apparatus of claim 1, further comprising multiple access lines stacked over the second polysilicon material.

4. The apparatus of claim 3, further comprising one or more liner materials between the one or more insulative materials and the multiple access lines.

5. The apparatus of claim 3, wherein the memory cells are at intersections between the pillars and the access lines.

6. The apparatus of claim 1, wherein an interface between the one or more insulative materials and the first polysilicon material is curved.

7. The apparatus of claim 1, wherein the intervening polysilicon material defines a seam within the intervening polysilicon material.

8. The apparatus of claim 1, further comprising a conductive source material, wherein the first polysilicon material, the second polysilicon material, the intervening polysilicon material, and the conductive source material form a source terminal for the memory cells.

9. The apparatus of claim 1, wherein the intervening polysilicon material separates the second polysilicon material from the one or more insulative materials.

10. An apparatus, comprising:
pillars defining memory cells; and
a source terminal for the memory cells, the pillars terminating at a proximal portion of the source terminal, the source terminal including an intervening polysilicon material between a first polysilicon material and a second polysilicon material, the intervening polysilicon material thicker at a distal edge away from the pillars than at the proximal portion and one or more of the first polysilicon material or the second polysilicon material are thinner at the distal edge than at the proximal portion.

11. The apparatus of claim 10, wherein the source terminal further comprises a conductive source material, the first polysilicon material, the intervening polysilicon material, and the second polysilicon material disposed over the conductive source material.

12. The apparatus of claim 11, wherein the conductive source material includes tungsten silicide ($WSi_x$).

13. The apparatus of claim 10, further comprising access lines stacked over the source terminal.

14. The apparatus of claim 10, wherein the intervening polysilicon material defines a seam therein away from the distal edge.

15. A computing system, comprising:
one or more processors; and
one or more memory devices comprising:
pillars defining memory cells; and
a source terminal, the pillars electrically connected to the source terminal, the source terminal including a thicker portion of an intervening polysilicon material at a distal edge away from the pillars than at a proximal portion laterally adjacent to the pillars.

16. The computing system of claim 15, wherein the intervening polysilicon material is tapered from the distal edge toward the pillars.

17. The computing system of claim 15, wherein the source terminal includes a first polysilicon material and a second polysilicon material, the intervening polysilicon material between the first polysilicon material and the second polysilicon material.

18. The computing system of claim 15, wherein the source terminal includes a seam within the intervening polysilicon material and defined by the intervening polysilicon material, the seam separated from the distal edge by the thicker portion of the intervening polysilicon material.

* * * * *